United States Patent
Yamada et al.

(10) Patent No.: US 10,529,385 B2
(45) Date of Patent: Jan. 7, 2020

(54) LAYERED SEMICONDUCTOR DEVICE, AND PRODUCTION METHOD THEREFOR

(71) Applicant: ULTRAMEMORY INC., Tokyo (JP)

(72) Inventors: Yasutoshi Yamada, Tokyo (JP); Kouji Uemura, Tokyo (JP); Takao Adachi, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 0 days.

(21) Appl. No.: 16/070,738

(22) PCT Filed: Dec. 22, 2016

(86) PCT No.: PCT/JP2016/088470
§ 371 (c)(1),
(2) Date: Jul. 17, 2018

(87) PCT Pub. No.: WO2017/126291
PCT Pub. Date: Jul. 27, 2017

(65) Prior Publication Data
US 2019/0043537 A1    Feb. 7, 2019

(30) Foreign Application Priority Data
Jan. 18, 2016    (WO) .................. PCT/JP2016/051316

(51) Int. Cl.
*G11C 5/14* (2006.01)
*G11C 29/04* (2006.01)
(Continued)

(52) U.S. Cl.
CPC .............. *G11C 5/14* (2013.01); *G11C 11/407* (2013.01); *G11C 29/04* (2013.01); *H01L 25/065* (2013.01); *H01L 25/07* (2013.01)

(58) Field of Classification Search
CPC ........... G11C 5/14; G11C 5/00; G11C 11/407; G11C 29/006; G11C 29/04;
(Continued)

(56) References Cited

U.S. PATENT DOCUMENTS

| 5,519,657 A | 5/1996 | Arimoto |
| 7,106,639 B2 * | 9/2006 | Taussig .................. G11C 29/76 365/130 |

(Continued)

FOREIGN PATENT DOCUMENTS

| JP | H06-076595 A | 3/1994 |
| JP | H07-169295 A | 7/1995 |

(Continued)

OTHER PUBLICATIONS

International Preliminary Report on Patentability for International Application No. PCT/JP2016/088470, 18 pages.

*Primary Examiner* — Tri M Hoang
(74) *Attorney, Agent, or Firm* — Muncy, Geissler, Olds & Lowe, P.C.

(57) ABSTRACT

A layered semiconductor device capable of improving production yield and a method for producing the layered semiconductor device. The layered semiconductor device has, layered therein, a plurality of semiconductor chips, a reserve semiconductor chip which is used as a reserve for the semiconductor chips, and a control chip for controlling the operating states of the plurality of semiconductor chips and the operating state of the reserve semiconductor chip. The semiconductor chips and the reserve semiconductor chip include contactless communication units and operating switches, and are capable of contactlessly communicating with another of the semiconductor chips via the contactless communication units. The control chip controls the operating states of the semiconductor chips by switching the operating switches of the semiconductor chips, and controls (Continued)

the operating state of the reserve semiconductor chip by switching the operating switch of the reserve semiconductor chip.

7 Claims, 9 Drawing Sheets

(51) Int. Cl.
*G11C 11/407* (2006.01)
*H01L 25/065* (2006.01)
*H01L 25/07* (2006.01)

(58) Field of Classification Search
CPC . G11C 29/4401; G11C 29/781; G11C 29/785; G11C 29/814; H01L 25/065; H01L 25/07; H01L 25/18
See application file for complete search history.

(56) References Cited

U.S. PATENT DOCUMENTS

| | | | |
|---|---|---|---|
| 7,477,545 B2* | 1/2009 | Tu | G11C 29/88 365/185.05 |
| 7,894,232 B2* | 2/2011 | Hanzawa | G01R 31/31715 365/163 |
| 7,898,893 B2* | 3/2011 | Park | G11C 5/02 365/148 |
| 8,446,772 B2* | 5/2013 | Tu | G11C 29/832 365/185.18 |
| 8,611,121 B2* | 12/2013 | Ahn | G11C 5/02 365/230.03 |
| 8,869,007 B2 | 10/2014 | Cordero et al. | |
| 8,916,417 B2 | 12/2014 | Higashi et al. | |
| 9,035,444 B2 | 5/2015 | Sato | |
| 2002/0130687 A1 | 9/2002 | Duesman | |
| 2003/0142545 A1 | 7/2003 | Imamiya et al. | |
| 2007/0058410 A1 | 3/2007 | Rajan | |
| 2009/0213634 A1 | 8/2009 | Shibata | |
| 2010/0110745 A1 | 5/2010 | Jeddeloh et al. | |
| 2012/0319757 A1 | 12/2012 | Sato | |
| 2013/0234339 A1 | 9/2013 | Higashi et al. | |
| 2014/0062587 A1 | 3/2014 | Koyanagi | |
| 2014/0176187 A1 | 6/2014 | Jayasena et al. | |
| 2014/0323046 A1 | 10/2014 | Asai et al. | |
| 2014/0376320 A1 | 12/2014 | Loh et al. | |
| 2015/0199246 A1 | 7/2015 | Miyazaki et al. | |

FOREIGN PATENT DOCUMENTS

| | | |
|---|---|---|
| JP | 2003-178589 A | 6/2003 |
| JP | 2004-535661 A | 11/2004 |
| JP | 2006-186247 A | 7/2006 |
| JP | 2008-299997 A | 12/2008 |
| JP | 2009-507324 A | 2/2009 |
| JP | 2009-206218 A | 9/2009 |
| JP | 2011-081883 A | 4/2011 |
| JP | 2012-064891 A | 3/2012 |
| JP | 2012-507820 A | 3/2012 |
| JP | 2013-004601 A | 1/2013 |
| JP | 2013-077767 A | 4/2013 |
| JP | 2014-053055 A | 3/2014 |
| JP | 2015-135577 A | 7/2015 |
| JP | 2015-197932 A | 11/2015 |
| WO | WO 2015/087450 A1 | 6/2015 |
| WO | WO2014/045518 A1 | 8/2016 |

* cited by examiner

LAYERED SEMICONDUCTOR DEVICE, AND PRODUCTION METHOD THEREFOR

TECHNICAL FIELD

The present invention relates to a semiconductor device. The present invention more particularly relates to a layered semiconductor device formed by layering a plurality of semiconductor chips and a production method therefor.

BACKGROUND ART

Increasing of capacity of a dynamic random access memory (DRAM) has been remarkably developed. In particular, in recent years, a layered DRAM in which a plurality of memory chips are layered has been proposed, and the capacity of the DRAM is further increased.

Meanwhile, in a case where a defect occurs in a portion of circuit components of the DRAM, a predetermined repair circuit (replacement circuit) is provided in the memory chip in order to repair the defective DRAM. For example, in a case where a defect is found in a word line (row) of the memory chip, another replacement word line is used instead of the defective word line. In addition, for example, in a case where a defect is found in a bit line (column) of the memory chip, another replacement bit line is used instead of the defective bit line. A word line or the like used instead thereof is an example of a repair circuit. A countermeasure against defects by providing a repair circuit in such a memory chip is similarly adopted in a layered DRAM.

FIGS. 8 and 9 are explanatory diagrams schematically illustrating a countermeasure against defects of a word line and a bit line in a layered DRAM 50 in the related art. In addition, in this specification, the term "layered DRAM" denotes a layered chip in which a plurality of semiconductor chips such as memory chips are layered or an electronic device as a DRAM provided with the layered chip.

FIG. 8 illustrates a state in which a plurality of semiconductor chips are layered to form the layered DRAM 50 (semiconductor chip) in the related art. As illustrated in the figure, the layered DRAM 50 in the related art is configured in which a plurality of memory chips CC0, CC1, CC2, and CC3 and one interface chip I/F are superimposed. In this figure, for the convenience of description, the number of memory chips CC is four, but other numbers may be used. The memory chip CC is a semiconductor chip including memory cells arranged on a matrix and circuits for controlling word lines, bit lines, and the like for the memory cells. The four memory chips CC0, CC1, CC2, and CC3 are functionally identical semiconductor chips. The interface chip I/F is a semiconductor chip including a logic circuit for controlling various signals between an external circuit and the memory chips CC. In addition, in this specification, the semiconductor chip may be simply referred to as a "chip". As illustrated in FIG. 8, a memory chip (for example, CC0) constituting the layered DRAM 50 includes circuit blocks BK0 to BK15 in which memory cells are arranged and a peripheral circuit group 52 (illustrated by hatching in the figure) to transmit and receive signals with respect to word lines and bit lines in the circuit blocks BK0 to BK15.

FIG. 9 is a schematic plan diagram of one memory chip CC0. In the figure, in a case where it is detected that the word line WL in the circuit block BK0 is defective, a word line RWL which is a repair circuit is used instead as illustrated in the figure. In this manner, the process of replacing the word line WL with the word line RWL is realized by changing the allocation of the addressing in the peripheral circuit group 52 or the like. In FIG. 9, in a case where it is detected that the bit line YS in the circuit block BK9 is defective, illustrated is a state in which the bit line RYS which is a repair circuit is used instead. The process of replacing the bit line YS with the bit line RYS is also executed by the peripheral circuit group 52 similarly to the case of the word line.

In the layered DRAM 50 of the related art, as described above, repair circuits are provided for the respective memory chips CC0 to CC3, and in a case where a defect is found, the corresponding repair circuit is used instead. In this manner, in the layered DRAM, the production yield rate of the product is improved.

CITED PATENT DOCUMENTS

For example, Patent Document 1 below discloses a semiconductor die having a switching matrix incorporated with at least one antifuse. According to this configuration, it is considered that signal paths on the semiconductor die can be selectively routed, and pin assignment of the chip can be reconstructed.

In addition, Patent Document 2 below discloses a mechanism for repairing a defective signal path in a layered semiconductor device by using through electrodes. In other words, each semiconductor chip is provided with a plurality of first through electrodes and one second through electrode. A semiconductor chip for control is provided with a means for switching and reconnecting one of the plurality of first through electrodes to the one second through electrode, and it is considered that it is possible to switch a defective through electrode.

In addition, Patent Document 3 below discloses a method for improving the production yield in the case of manufacturing a layered semiconductor device by using a W2 W method. In the method disclosed herein, first, m wafers are layered and diced to form a first layered chip. Next, n wafers are layered and diced to form a second layered chip. After classifying the first layered chip and the second layered chip on the basis of the number of defective chips, the first layered chip and the second layered chip are combined.

According to such a method, it is considered that the defect rate of the chip after combination can be reduced.

Patent Document 1: Japanese Unexamined Patent Application (Translation of PCT Application), Publication No. 2004-535661

Patent Document 2: Japanese Unexamined Patent Application, Publication No. 2013-004601

Patent Document 3: Japanese Unexamined Patent Application (Translation of PCT Application), Publication No. 2013-077767

DISCLOSURE OF THE INVENTION

Problems to be Solved by the Invention

As described above, in the layered DRAM 50 in the related art, defects can be removed by using a repair circuit in a case where the defects occur in unit of a word line or in unit of a bit line unit. However, in a case where a defect occurs in unit of a circuit block BK, it is difficult to repair the defective layered DRAM. This also applies to a case where a defect occurs in unit of a storage device bank or in unit of a MAT circuit in addition to a circuit block. Herein, the MAT circuit denotes a collective name covering a circuit block in which memory cells are arranged and in which word lines and bit lines are arranged, a driving circuit of the word lines for the circuit block, sense circuits arranged at both ends of the bit lines, and the like. More specifically, the MAT circuit is a collective name covering the circuit block BK in FIG. 8, and the like and the peripheral circuit group 52 around the circuit block.

As a result of such circumstances, in the layered DRAM 50 in which a plurality of memory chips CC0 to CC4 and the like are layered, it is considered that the defective product ratio is exponentially increased with an increase in the number of memory chips to be configured. In particular, in the case of so-called WOW (Wafer on Wafer) layering, even in a case where a current-defective chip exists, the defective chip is also layered, so that it is also considered that the production yield of the layered chip is greatly deteriorated.

The present invention has been made in view of the above problems, and an object of the present invention is to provide a layered semiconductor device capable of improving the production yield rate, and to provide a method for manufacturing the layered semiconductor device.

Means for Solving the Problems (1) In order to solve problems described above, the present invention provides a layered semiconductor device including, layered therein: a plurality of semiconductor chips; a reserve semiconductor chip which is used as a reserve for the semiconductor chip; and a control chip which controls operating states of the plurality of semiconductor chips and an operating state of the reserve semiconductor chip, in which the semiconductor chips and the reserve semiconductor chip include a contactless communication unit and an operating switch, in which the semiconductor chips and the reserve semiconductor chip are capable of communicating with other semiconductor chips in a contactless manner through the contactless communication unit, and in which the control chip controls the operating state of the semiconductor chip by switching the operating switch of the semiconductor chip and controls the operating state of the reserve semiconductor chip by switching the operating switch of the reserve semiconductor chip.

(2) In addition, according to the present invention, in the layered semiconductor device according to (1), in a case where a defective chip is found among the plurality of semiconductor chips, the control chip switches the operating switch on the defective chip to set the defective chip to be in a non-operating state and switches the operating switch on the reserve semiconductor chip to set the reserve semiconductor chip to be in an operating state.

(3) In addition, according to the present invention, in the layered semiconductor device according to (2), the control chip may include: a storage unit which stores information indicating which semiconductor chip is a defective chip; and a control unit which switches the operating switch on the defective chip and switches the operating switch on the reserve semiconductor chip on the basis of the information stored in the storage unit.

(4) In order to solve problems described above, the present invention provides a layered semiconductor device including, layered therein: a plurality of semiconductor chips; a reserve semiconductor chip which is used as a reserve for the semiconductor chip; and a control chip which controls operating states of circuit blocks of the plurality of semiconductor chips and an operating state of a circuit block of the reserve semiconductor chip, in which the semiconductor chips and the reserve semiconductor chip include a contactless communication unit, a plurality of the circuit blocks, and an operating switch which is provided for each of the plurality of circuit blocks and switches the operating state of each of the circuit blocks, in which the semiconductor chips and the reserve semiconductor chip are capable of communicating with other semiconductor chips in a contactless manner through the contactless communication unit, and in which the control chip controls the operating state of each of the circuit blocks of the semiconductor chip by switching the operating switch of the semiconductor chip and controls the operating state of the circuit block of each of the reserve semiconductor chips by switching the operating switch of the reserve semiconductor chip.

(5) In addition, according to the present invention, in the layered semiconductor device according to (4), in a case where a defective block is found among the plurality of circuit blocks, the control chip switches the operating switch provided in the defective block to set the defective block to be in a non-operating state and switches the operating switch provided in the circuit block on the reserve semiconductor chip corresponding to the defective block to set the circuit block provided with the switched operating switch instead of the defective block to be in an operating state.

(6) In addition, according to the present invention, in the layered semiconductor device according to (5), the control chip may include: a storage unit which stores information indicating which circuit block is a defective block; and a control unit which switches the operating switch on the defective block and switches the operating switch provided in the circuit block on the reserve semiconductor chip corresponding to the defective block on the basis of the information stored in the storage unit.

(7) In order to solve problems described above, the present invention provides a layered semiconductor device including, layered therein: a plurality of semiconductor chips; a reserve semiconductor chip which is used as a reserve for the semiconductor chip; and a control chip which controls states of access to control lines of the plurality of semiconductor chips and a state of access to a control line of the reserve semiconductor chip, in which the semiconductor chips and the reserve semiconductor chip include a contactless communication unit and are capable of communicating with other semiconductor chips in a contactless manner through the contactless communication unit, and in which the control chip is capable of switching between the access to the control line of the semiconductor chip based on an external control signal and the access to the control line of the reserve semiconductor chip.

(8) In addition, according to the present invention, in the layered semiconductor device according to (7), in a case where a defect is detected in any one of the control lines among a plurality of the control lines, the control chip is capable of switching the access to the control line for which the defect is detected to the access to the control line of the reserve semiconductor chip.

(9) In addition, according to the present invention, in the layered semiconductor device according to (7), in a case where a defective chip is found among the plurality of semiconductor chips, the control chip is capable of switching the access to the control line of the defective chip to the access to the control line of the reserve semiconductor chip, in a case where a defective block is found among a plurality of the semiconductor chips, the control chip is capable of switching the access to the control line of the defective block to the access to the control line of the reserve semiconductor chip, or in a case where a bit defect or a word line defect is found on the semiconductor chip, the control chip is capable of switching the access to the control line of the semiconductor chip on which the bit defect or the word defect is found to the access to the control line of the reserve semiconductor chip.

(10) In addition, according to the present invention, in the layered semiconductor device according to (8), the control chip includes: a storage unit which stores information indicating which control line is defective; a determination unit which determines whether or not an access to the defective control line occurs on the basis of the information stored in the storage unit; and a control unit which switches the access to the defective control line to the access to the control line of the reserve semiconductor chip in a case where the determination unit determines that the access to the defective control line occurs.

(11) In addition, according to the present invention, in the layered semiconductor device according to (9), the control chip includes: a storage unit that stores information indicating which semiconductor chip is defective, which circuit block is a defective block, which bit line is in a bit defect, or which word line is in a word line defect; a determination unit which determines whether or not an access to the control line of the semiconductor chip in which any one of the defects is found occurs on the basis of the information stored in the storage unit; and a control unit which switches the access to the control line of the semiconductor chip in which any one of the defects is found to the access to the control line of the reserve semiconductor chip in a case where the determination unit determines that the access to the control line of the semiconductor chip in which any one of the defects is found occurs.

(12) In addition, according to the present invention, in the layered semiconductor device according to any one of (1) to (11), the semiconductor chip is a semiconductor memory chip capable of storing information, and the control chip is an interposer chip for connecting the semiconductor memory chip and an external circuit.

(13) In addition, according to the present invention, a method of manufacturing the layered semiconductor device according to (3), includes: a wafer inspection step of inspecting a semiconductor wafer including a plurality of the semiconductor chips and a semiconductor wafer including the reserve semiconductor chip and detecting information on a defective semiconductor chip;
a first layering step of layering the semiconductor wafer including the plurality of semiconductor chips subjected to the inspection and the semiconductor wafer including the reserve semiconductor chip; a dicing step of dicing the layered semiconductor wafer group to form the layered semiconductor chip in which the semiconductor chips and the reserve semiconductor chip are layered; a second layering step of layering the layered semiconductor chip and the control chip; and a storage step of storing the information on the defective semiconductor in the storage unit of the control chip.

(14) In addition, according to the present invention, a method of manufacturing the layered semiconductor device according to (3) includes: a wafer inspection step of inspecting a semiconductor wafer including a plurality of the semiconductor chips and a semiconductor wafer including the reserve semiconductor chip and detecting information on a defective semiconductor chip; a third layering step of layering the semiconductor wafer including the plurality of semiconductor chips subjected to the inspection, the semiconductor wafer including the reserve semiconductor chip, and a semiconductor wafer including the control chip; a storage step of storing the information on the defective semiconductor in the storage unit of the control chip; and a dicing step of dicing the layered semiconductor wafer group to form the layered semiconductor chip in which the semiconductor chips, the reserve semiconductor chip, and the control chip are layered.

(15) In addition, according to the present invention, a method of manufacturing the layered semiconductor device according to (6) includes: an on-wafer block inspection step of inspecting a semiconductor wafer including a plurality of the semiconductor chips and a semiconductor wafer including the reserve semiconductor chip and detecting information on a defective circuit block in the semiconductor chip included in the semiconductor wafer; a first layering step of layering a plurality of the semiconductor wafers including the semiconductor chip including the circuit block subjected to the inspection and the semiconductor wafer including the reserve semiconductor chip; a dicing step of dicing the layered semiconductor wafer group to form the layered semiconductor chip in which the semiconductor chips and the reserve semiconductor chip are layered; a second layering step of layering the layered semiconductor chip and the control chip; and a storage step of storing the information on the defective circuit block in the storage unit of the control chip.

(16) In addition, according to the present invention, a method of manufacturing the layered semiconductor device according to (6) includes: an on-wafer block inspection step of inspecting a semiconductor wafer including a plurality of the semiconductor chips and a semiconductor wafer including the reserve semiconductor chip and detecting information on a defective circuit block in the semiconductor chip included in the semiconductor wafer; a third layering step of layering a plurality of the semiconductor wafers including the semiconductor chip including the circuit block subjected to the inspection, the semiconductor wafer including the reserve semiconductor chip, and a semiconductor wafer including the control chip; a storage step of storing the information on the defective circuit block in the storage unit of the control chip; and a dicing step of dicing the layered semiconductor wafer group to form the layered semiconductor chip in which the semiconductor chips, the reserve semiconductor chip, and the control chip are layered.

(17) In addition, according to the present invention, a method of manufacturing the layered semiconductor device according to (10) or (11) includes: a first layering step of layering the semiconductor wafer including the plurality of semiconductor chips and the semiconductor wafer including the reserve semiconductor chip; an on-wafer control line inspection step of inspecting the layered semiconductor wafer group and detecting information on a defective control line in the semiconductor chip included in the semiconductor wafer; a dicing step of dicing the layered semiconductor wafer group to form the layered semiconductor chip in which the semiconductor chips and the reserve semiconductor chip are layered; a second layering step of layering the layered semiconductor chip and the control chip; and a storage step of storing the information on the defective control line in the storage unit of the control chip.

(18) In addition, according to the present invention, a method of manufacturing the layered semiconductor device according to (10) or (11) includes: a third layering step of layering a semiconductor wafer including the plurality of semiconductor chips, a semiconductor wafer including the reserve semiconductor chip, and a semiconductor wafer including the control chip; an on-wafer control line inspection step of inspecting the layered semiconductor wafer group and detecting information on a defective control line in the semiconductor chip included in the semiconductor wafer; a storage step of storing the information on the defective control line in the storage unit of the control chip; and a dicing step of dicing the layered semiconductor wafer group to form the layered semiconductor chip in which the semiconductor chips, the reserve semiconductor chip, and the control chip are layered.

(19) In addition, according to the present invention, a method of manufacturing the layered semiconductor device according to (10) or (11) includes: a control line inspection step of inspecting the layered semiconductor chip in which the semiconductor chips and the reserve semiconductor chip are layered and detecting information on a defective control line in the semiconductor chip; and a storage step of storing the information on the defective control line in the storage unit of the control chip.

(20) In addition, in the method for manufacturing a layered semiconductor device according to (13) or (14), the semiconductor chip is a semiconductor memory chip capable of storing information, and the control chip is an interposer chip for connecting the semiconductor memory chip and an external circuit.

Effects of the Invention

As described above, according to the present invention, it is possible to provide a layered semiconductor device and a method for manufacturing the same capable of avoiding a defect by providing a reserve semiconductor chip, so that it is possible to improve the production yield.

PREFERRED MODE FOR CARRYING OUT THE INVENTION

Hereinafter, layered DRAMs (semiconductor memory devices) according to preferred embodiments of the present invention will be described in detail with reference to the drawings. In addition, the embodiments to be described below are examples as a realization means of the present invention and should be modified or altered appropriately depending on the configuration of the apparatus to which the present invention is applied and various conditions, but the present invention is not limited to the following embodiments.

1. First Embodiment

Configuration

Figure 1:
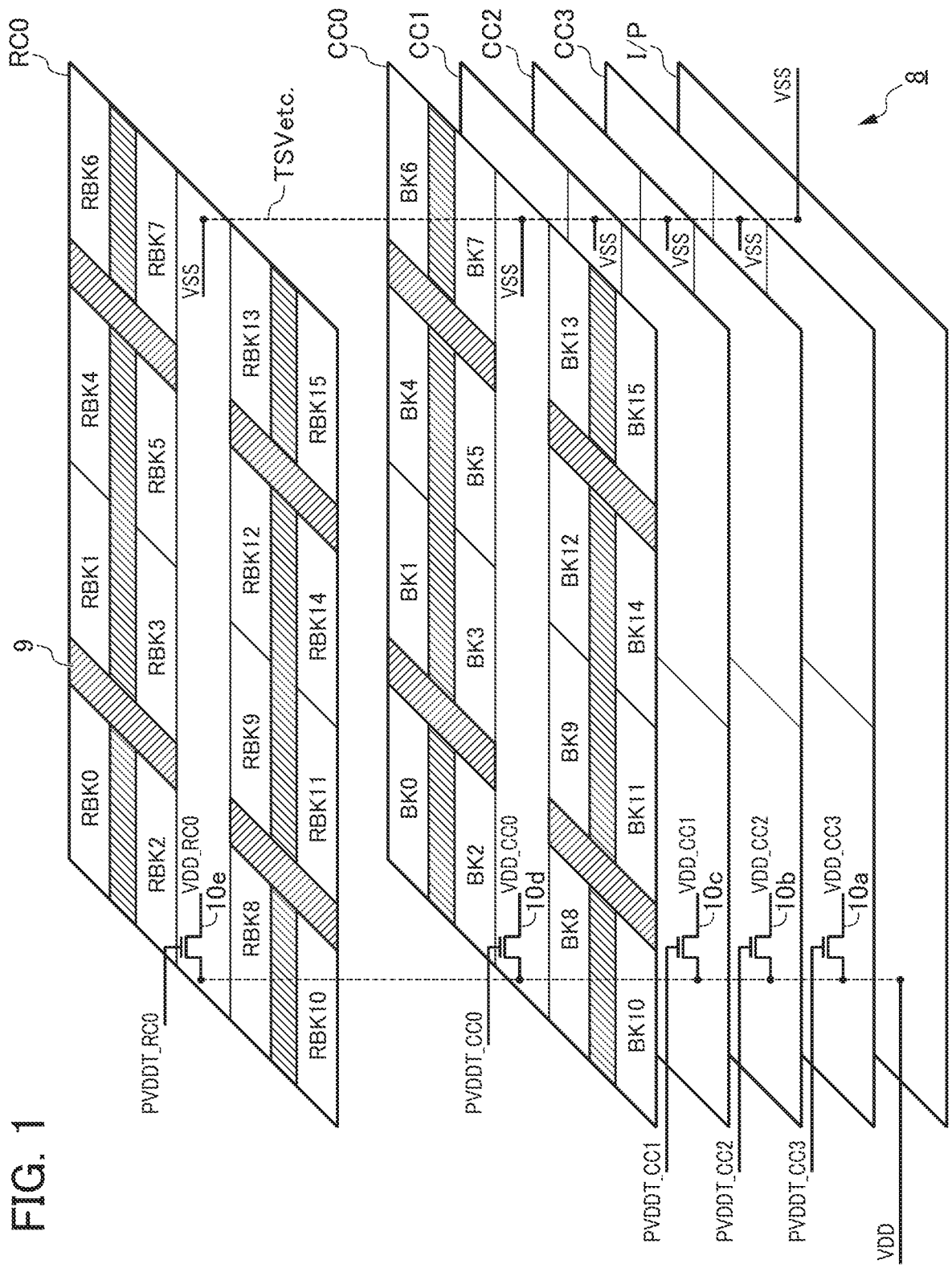
FIG. 1 is a chip configuration diagram of a layered DRAM 8 according to a first embodiment.

FIG. 1 is a chip configuration diagram schematically illustrating a configuration of a semiconductor chip of the layered DRAM 8 according to this embodiment.

As illustrated in the figure, in the layered DRAM 8, a plurality of memory chips CC0, CC1, CC2, and CC3 are superimposed and bonded by, for example, fusion bonding. As the bonding, a method using an adhesive or another method such as a surface activated room-temperature bonding or the like may be used. In addition, as illustrated in the figure, an interposer chip I/P is bonded to one side of a plurality of memory chips CC0 to CC3 (hereinafter, CC0 to CC3 are abbreviated as CC), and a reserve memory chip RC0 for reserve of the memory chip CC is bonded on the other surface side thereof.

Memory Chip, Reserve Memory Chip

Similarly to the memory chip in the related art, the memory chip CC is a semiconductor chip which includes circuit blocks BK0 to BK15 in which the memory cells are arranged and a peripheral circuit group 9 which transmits and receives signals between the word lines and the bit lines in the circuit block BK. The reserve memory chip RC0 is also a semiconductor chip having the same configuration as that of the memory chip CC and is a semiconductor chip to be used as a reserve for the regular memory chip CC.

In addition, clamp MOSFETs 10*a*, 10*b*, 10*c*, 10*d*, and 10*e* are provided on the VDD (positive power supply) line as a power supply in the memory chips CC and the reserve memory chip RC in this embodiment. In addition, the control signals (gate signals) PVDDT_CC0, PVDDT_CC1, PVDDT_CC2, PVDDT_CC3, and PVDDT_RC0 are externally applied to the clamp MOSFETs 10*a* to 10*e*, respectively. Therefore, if the clamp MOSFET 10 is turned on by these control signals, it is possible to supply power to the memory chip CC and the reserve memory chip RC. In other words, if the control signal (gate signal) is turned on, the clamp MOSFET 10 is turned on.

On the other hand, if the clamp MOSFET 10 is turned off by these control signals, power supply to the memory chip CC and the reserve memory chip RC can be turned off. That is, if the control signal (gate signal) is turned off, the clamp MOSFET 10 is turned off. The characteristic feature of this embodiment is in that by these control signals from the outside, the power supply to the memory chips CC and the reserve memory chip RC is controlled, and the operation/non-operation of the memory chips CC and the reserve memory chip RC can controlled.

Interposer Chip I/P

The interposer chip I/P is a semiconductor chip for connecting the memory chips CC and the reserve memory chip RC0 to another device such as an external CPU. In addition, the interposer chip I/P includes a logic circuit for controlling the memory chips CC and the reserve memory chip RC0, and also has a function of an interface I/F as described above.

In addition, the interposer chip I/P in this embodiment supplies power to the memory chips CC and the reserve memory chip RC0. That is, the power supply VDD of the memory chips CC and the reserve memory chip RC0 is supplied from the interposer chip I/P by so-called through-silicon via (TSV) (refer to FIG. 1). Similarly, supply of VSS (ground) to the memory chips CC and the reserve memory chip RC0 is also performed by the TSV from the interposer chip I/P (refer to FIG. 1). In addition, for each of the memory chips CC and reserve memory chip RC0, the VDD line is connected to the clamp MOSFET 10. That is, power supply to each of the memory chips CC and the reserve memory chip RC0 is supplied via the clamp MOSFET 10.

In addition, the interposer chip I/P also outputs a control signal for each clamp MOSFET 10. This control signal is transmitted between the chips by using a contactless communication technology called so-called ThruChip Interface (TCI). In this embodiment, as the TCI, a technology of transmitting a signal by magnetic field coupling using a coil provided on each of the semiconductor chips is adopted, but another technology may be used. The coil and the amplifier circuit for driving the coil, and the circuit for receiving the coil signal realize the TCI and are a means for executing the contactless communication.

In this embodiment, the power supply lines (VDD line (positive power supply) and VSS line (ground)) are supplied to each of the semiconductor chips by using the TSV, but the data signals, address signals, and other control signals are communicated in a contactless manner between the semiconductor chips by using the TCI technology. For example, the control signals PVDDT_CC0, PVDDT_CC1, PVDDT_CC2, PVDDT_CC3, and PVDDT_RC0 output from the interposer chip I/P are supplied from the interposer chip I/P to the memory chips CC and the reserve memory chip RC0 by using the TCI technology.

Operation of Layered DRAM 8

Figure 2:
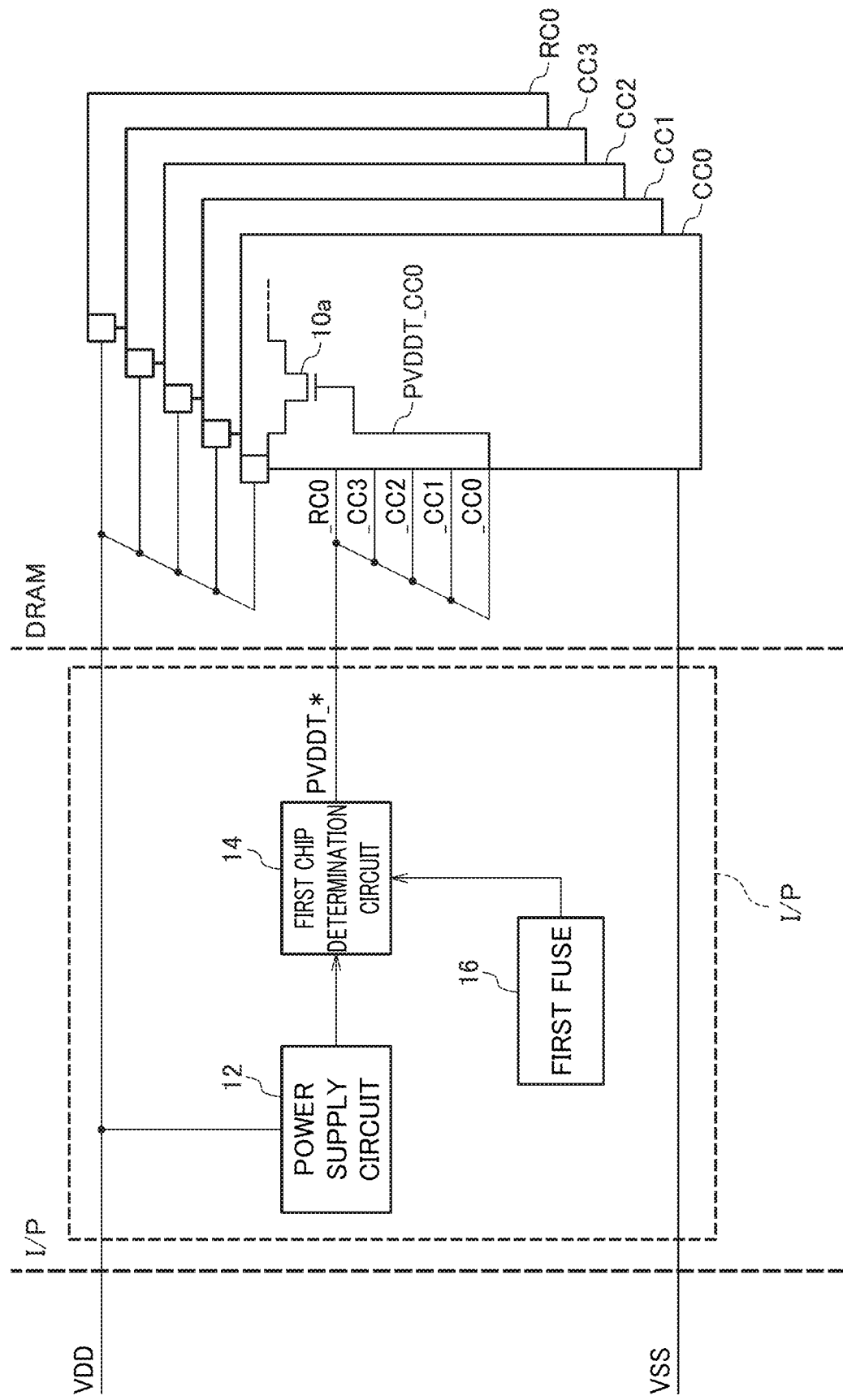
FIG. 2 is an explanatory diagram illustrating a connection configuration between chips of the layered DRAM 8 according to the first embodiment.

FIG. 2 illustrates the signal connection between the functional block of the interposer chip I/P and the memory chips CC and the reserve memory chip RC. As illustrated in the figure, the power supply line VDD (positive power supply) for the layered DRAM 8 is first supplied to the interposer chip I/P, and is supplied from the interposer chip I/P through the TSV to each of the memory chips CC and the reserve memory chip RC0. In each of the memory chips CC and the reserve memory chip RC0, power is supplied to each internal circuit through the clamp MOSFET 10.

As illustrated in FIG. 2, the interposer chip I/P includes a power supply circuit 12 connected to a power supply VDD, a first chip determination circuit 14, and a first fuse circuit 16. The power supply circuit 12 adjusts the power used by the interposer chip I/P. The first chip determination circuit 14 monitors the power supply from the power supply circuit 12, and in a case where power is supplied (that is, when the power supply is turned on), the first chip determination circuit 14 can output the control signal PVDDT_CC0 and the like to the memory chips CC and the reserve memory chip RC0 on the basis of the contents stored in the first fuse circuit 16. Herein, the first fuse circuit 16 is a storage unit and is a means for storing a defective chip. In a case where any of the memory chips CC0 to CC3 is defective, the first fuse circuit 16 stores the defective memory chip CC.

For example, it is preferable to store the results of the wafer test or the like in the first fuse circuit 16. In the wafer test or the like, in a case where the memory chip CC0 is defective, the information is stored in the first fuse circuit 16. The first fuse circuit is configured with a plurality of fuses and can disconnect a predetermined fuse by applying a high voltage from the outside or the like. According to the disconnection state of the fuse, the first fuse circuit 16 can store which memory chip CC is defective. As described above, the first chip determination circuit 14 can determine which memory chip CC is defective by referring to the first fuse circuit 16 when the power-supply is turned on. Then, the first chip determination circuit 14 adjusts the control signal (for example, PCDDT_CC0) to the defective memory chip CC (for example, CC0) to a predetermined potential and turns off the clamp MOSFET 10a.

As a result, the memory chip CC0 is not supplied with power and, thus, is in a non-operating state. In addition, the first chip determination circuit 14 adjusts the control signal PVDDT_RC0 to a predetermined potential in order to and to set the reserve memory chip RC0 to be in the operating state instead of the memory chip CC0 set to be in the non-operating state. As a result, the reserve memory chip RC0 is supplied with power and, thus, is in an operating state.

As a result of such processing, instead of the defective memory chip CC (for example, CC0), the reserve memory chip RC0 can be used as a memory chip, so that the possibility of the layered DRAM 8 becoming defective can be reduced, and thus, it is possible to improve the production yield of the layered DRAM 8.

In addition, the defect of the memory chip CC in this embodiment corresponds to, for example, a current-defect, a large-scale block defect, and the like, but not limited thereto, various defects are applicable. In addition, if no defect is detected in the memory chip CC, the reserve memory chip RC0 is set to be in a non-operating state, and all of the (regular) memory chips CC are set to be in an operating state.

First Embodiment: Summary

The characteristic feature of the layered DRAM 8 according to the first embodiment is that a reserve memory chip RC0 as a reserve for the memory chip CC is provided. Therefore, even in a case where any one of the memory chips CC is defective, it is possible to use the reserve memory chip instead of the defective memory chip CC. As described above, according to the first embodiment, it is possible to reduce the defect rate of the layered DRAM, so that it is possible to improve the production yield rate of the layered DRAM. In particular, even when a current-defective chip is present at the time of wafer on wafer (WOW) layering, the entire layered chips can be repaired, so that it is possible to suppress a reduction in production yield of the layered DRAM.

Although the layered DRAM 8 has been described as an example in the first embodiment, any layered semiconductor device may be used as long as it is a layered chip in which a plurality of semiconductor chips are layered or a layered semiconductor device including a layered chip. That is, the layered DRAM 8 according to this embodiment corresponds to a preferred example of the layered semiconductor device in the claims. That is, the layered semiconductor device in the claims includes a layered chip such as the layered DRAM 8 and a semiconductor device including the layered chip.

In addition, the memory chip CC corresponds to a preferred example of the semiconductor chip in the claims, and the reserve memory chip RC0 corresponds to a preferred example of the reserve semiconductor chip in the claims. In addition, the clamp MOSFET 10 corresponds to a preferred example of the operating switch in the claims, and the interposer chip I/P corresponds to a preferred example of the control chip in the claims. In addition, on the respective chips, the coil for performing contactless communication, the amplifier circuit for driving the coil, and the circuit for receiving the coil signal correspond to a preferred example of the contactless communication unit in the claims. In addition, in this specification, the layered chip corresponds to a preferred example of the layered semiconductor chip in the claims.

2. Second Embodiment

In the first embodiment, the memory chips (CC0 to CC3) to be superimposed and bonded are adopted as a unit of defect to be detected. In the second embodiment, a channel is adopted as a unit of defect to be detected. In other words, in the second embodiment, in a case where a plurality of channels are arranged on each memory chip CC, defect detection is performed for each channel, and a channel determined to be defective is set to be in a non-operating state. Hereinafter, the second embodiment will be described in detail with reference to the drawings.

Configuration

Figure 3:
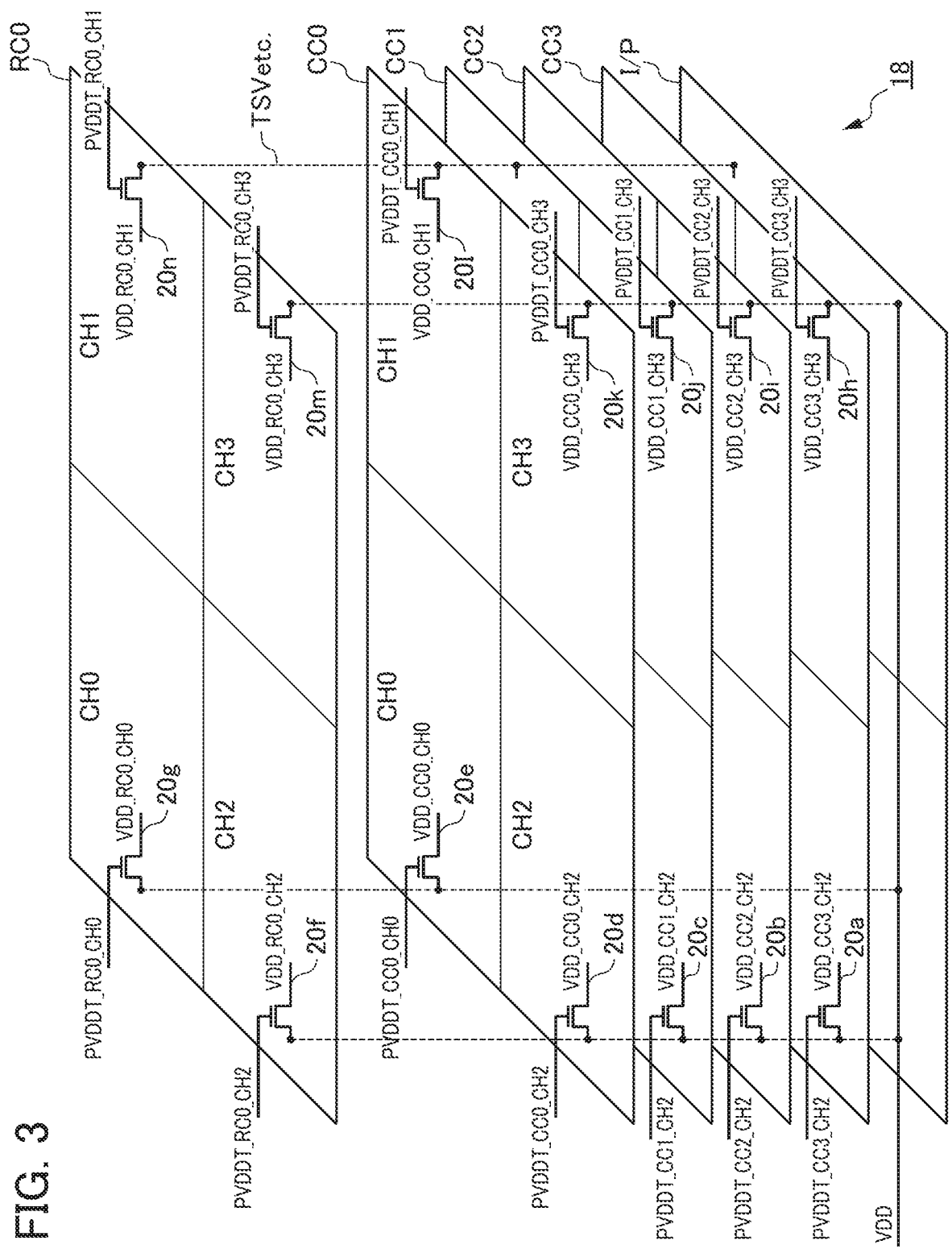
FIG. 3 is a chip configuration diagram of a layered DRAM 18 according to a second embodiment.

FIG. 3 is a chip configuration diagram schematically illustrating a configuration of the layered DRAM 18 according to the second embodiment similar to FIG. 1 in the first embodiment. Similarly to the first embodiment, in the layered DRAM 18 according to the second embodiment, a plurality of memory chips CC0, CC1, CC2, and CC3 are superimposed and bonded. In addition, similarly to the first embodiment, an interposer chip I/P is bonded to one surface of the plurality of memory chips CC superimposed thereon, and a reserve memory chip RC0 for reserve of the memory chip CC is bonded on the other surface side thereof.

Memory Chip CC, Reserve Memory Chip RC0

Unlike the first embodiment, the memory chip CC according to the second embodiment includes a plurality of channels, and thus, a layered chip (layered DRAM 28) of a channel configuration type is configured as a whole. As illustrated in FIG. 3, each memory chip CC includes four channels CH0, CH1, CH2, and CH3. In addition, as illustrated in FIG. 3, the reserve memory chip RC0 according to the second embodiment also has four channels similarly to the memory chip CC. In the configuration of the layered chip having such a channel configuration type, an address and a command circuit are provided in unit of a channel.

Furthermore, in the memory chip CC and the reserve memory chip RC according to the second embodiment the power supply trunk lines are separated in unit of a channel, and each includes a clamp MOSFET 20*a*, 20*b*, 20*c*, 20*d*, 20*e*, 20*f*, 20*g*, 20*h*, 20*i*, 20*j*, 20*k*, 20*l*, 20*m*, or 20*n*. In addition, a control signal (gate signal) is applied to each of the clamp MOSFETs 20*a* to 20*n*. For example, four types of control signals PVDDT_CC0_CH0, PVDDT_CC0_CH1, PVDDT_CC0_CH2, and PVDDT_CC0_CH3 are applied to the four channels of the memory chip CC0. Similarly, the other memory chips CC1 to CC3 are provided with clamp MOSFETs 20 for every four channels, and the control signals PVDDT_CCX_CHY are applied thereto. Herein, X of CCX is 0 to 3 representing the chip numbers, and Y of CHY is 0 to 3 representing the channel numbers.

In the second embodiment, in a case where a defect such as a local defect or a power short circuit in a channel is detected in the memory chip CC, the replacement with the reserve memory chip RC0 is performed in unit of a channel. As described above, the characteristic feature of the second embodiment is that in the first embodiment, the unit to be repaired is a unit of a memory chip, whereas the unit to be repaired is a smaller unit of a channel. Since the unit to be repaired is reduced in this manner, improvement of the production yield rate of the layered chip can be expected as compared with the first embodiment.

Interposer Chip I/P

Similarly to the first embodiment, the interposer chip I/P according to the second embodiment is a semiconductor chip for connecting the memory chips CC and the reserve memory chip RC0 to another device such as an external CPU. In addition, similarly, the interposer chip has a function of an interface I/F. The interposer chip I/P according to the second embodiment supplies control signals (gate signals) for the clamp MOSFETs 20 of the respective channels of the memory chip CC and the reserve memory chip RC0 and controls the operation/non-operation for each channel on each memory chip CC.

In addition, this control signal is transmitted by using the ThruChip Interface (TCI) technology similar to that of the first embodiment. For this purpose, coils used for TCI are provided on each semiconductor chip of the memory chip CC, the reserve memory chip RC0, and the interposer chip I/P, and control signals are transmitted by magnetic field coupling. In addition, data signals, address signals, other control signals, and the like are also communicated by using TCI technology. For example, the control signal PVDDT_CC0_CH0 or the like output from the interposer chip I/P is supplied from the interposer chip I/P to the memory chip CC and the reserve memory chip RC0 by using the TCI technology.

Operation of Layered DRAM 18

The operations of the layered DRAM 18 according to the second embodiment are substantially the same as those of the layered DRAM 8 in the first embodiment. The state of the signal connection between the function block of the interposer chip I/P and the memory chip CC and the reserve memory chip RC is also the same as that in FIG. 2 in the first embodiment.

The operations of the layered DRAM 28 according to the second embodiment are different from those of the layered DRAM 8 according to the first embodiment in terms of the unit for controlling the operation/non-operation, but the basic operations thereof are the same. That is, for example, in a case where the channel CH0 on the memory chip CC0 is defective as a result of the wafer test, the information is stored in the first fuse circuit 16 in FIG. 2. Then, the first chip determination circuit 14 monitors the power supply from the power supply circuit 12, and in a case where power is supplied (that is, when the power supply is turned on), the first chip determination circuit 14 can output the control signal PVDDT_CC0_CH0 and the like to the clamp MOSFET 20 of the channel on the memory chips CC and the reserve memory chips RC0 on the basis of the contents stored in the first fuse circuit 16. In a case where any one of the channels on the memory chip CC is defective, the first fuse circuit 16 stores the defective channel.

As described above, the first chip determination circuit 14 can determine which channel is defective by referring to the first fuse circuit 16 when the power supply is turned on.

Then, the first chip determination circuit 14 adjusts the control signal (for example, PCDDT_CC0_CH0) to the defective channel (for example, the channel 0 of the memory chip CC0) to a predetermined potential (for example, OFF) to turn off the clamp MOSFET 20*e*. As a result, the channel CH0 of the memory chip CC0 is not supplied with power and, thus, is in a non-operating state. Furthermore, the first chip determination circuit 14 adjusts the control signal PVDDT_RC0_CH0 to a predetermined potential in order to set the channel CH0 on the reserve memory chip RC0 to be in the operating state instead of the channel CH0 on the memory chip CC0 set in the non-operating state. As a result, the channel CH0 on the reserve memory chip RC0 is supplied with power and, thus, is in an operating state.

Repair of Plurality of Channels

In addition, even in a case where defects are detected in a plurality of channels of the plurality of memory chips CC, there are cases in which the first chip determination circuit 14 may repair the defective chips. In the example of the second embodiment, since the reserve memory chip RC0 (and the memory chips CC) has four channels, even in a case where a defect is detected in the four channels of any memory chip CC, there are cases in which the defective chips can be repaired.

For example, in a case where a defect in the channel CH0 of the memory chip CC0 is detected, the channel is replaced with the channel CH0 of the reserve memory chip RC0 is as described above. In the second embodiment, in addition to this, in a case where a defect of the channel CH1 of the memory chip CC1 is detected, the channel can be replaced with the channel CH1 of the reserve memory chip RC0. It is possible to replace the channel CH1 by controlling the clamp MOSFET 20 provided in each channel and switching the operation/non-operating state of each channel. Similarly, in a case where a defect is detected in the channel CH3 or CH4 on any of the memory chips CC, the channel can be replaced with the channel CH3 or CH4 of the reserve memory chip RC0. As a result, according to the second embodiment, even in a case where defects in a plurality of channels are detected, it is possible to achieve repair by replacing the defective channel with the channel on the reserve memory chip.

As described above, even in a case where defects in a plurality of channels are detected, the detection result is stored in the first fuse circuit 16. The first chip determination circuit 14 can generate a control signal for the clamp MOSFET 20 on the basis of the stored contents of the first fuse circuit 16 when the power supply is turned on.

Second Embodiment: Summary

As a result of such processing, for example, the channel CH0 of the reserve memory chip RC0 can be used instead of the channel CH0 of the memory chip CC0 which is defective, so that it is possible to reduce the possibility that the layered DRAM 28 will be defective, and thus, it is possible to improve the production yield of the layered DRAM 28. As described above, the characteristic feature of the layered DRAM 28 according to the second embodiment is in that defect detection is performed in unit of a channel in the memory chip CC. In addition, the configuration that the operation/non-operation is also controlled in unit of a channel is similarly a characteristic matter.

In the second embodiment, detection and control are performed in unit of channels as described above, but the present invention is not limited to channels. For example, it is also preferable to perform the detection and control in unit of bank of memories, and it is also preferable to perform the detection and control in unit of smaller circuits.

3. Third Embodiment

In the first embodiment, defect detection is performed for each memory chip CC, and the memory chip CC in which a defect is detected is replaced with the reserve memory chip RC0 to realize repair of the defective memory chip CC. In this case, the defective memory chip CC is replaced with the reserve memory chip RC0 by controlling the power trunk line and switching the power supply.

In the third embodiment, an example in which defect detection is performed (or defect finding is performed) in unit of a predetermined control line (for example, a word line), and the control line (for example, the word line) is replaced with a control line (word line) of the reserve memory chip RC0 will be described. In this case, unlike the first embodiment, switching the power supply complicates the circuit configuration and, thus, is not realistic, so that switching of the control line to the memory chip CC as an object to be repaired is performed, and a functional circuit replacement is performed. An example of repairing a defective circuit (control line) in this manner will be described in the third embodiment. In addition, the control lines in the third embodiment may be various control lines in addition to word lines and bit lines and may also include lines such as memory read and write commands. Hereinafter, the third embodiment will be described in detail with reference to the drawings.

Configuration

Figure 4:
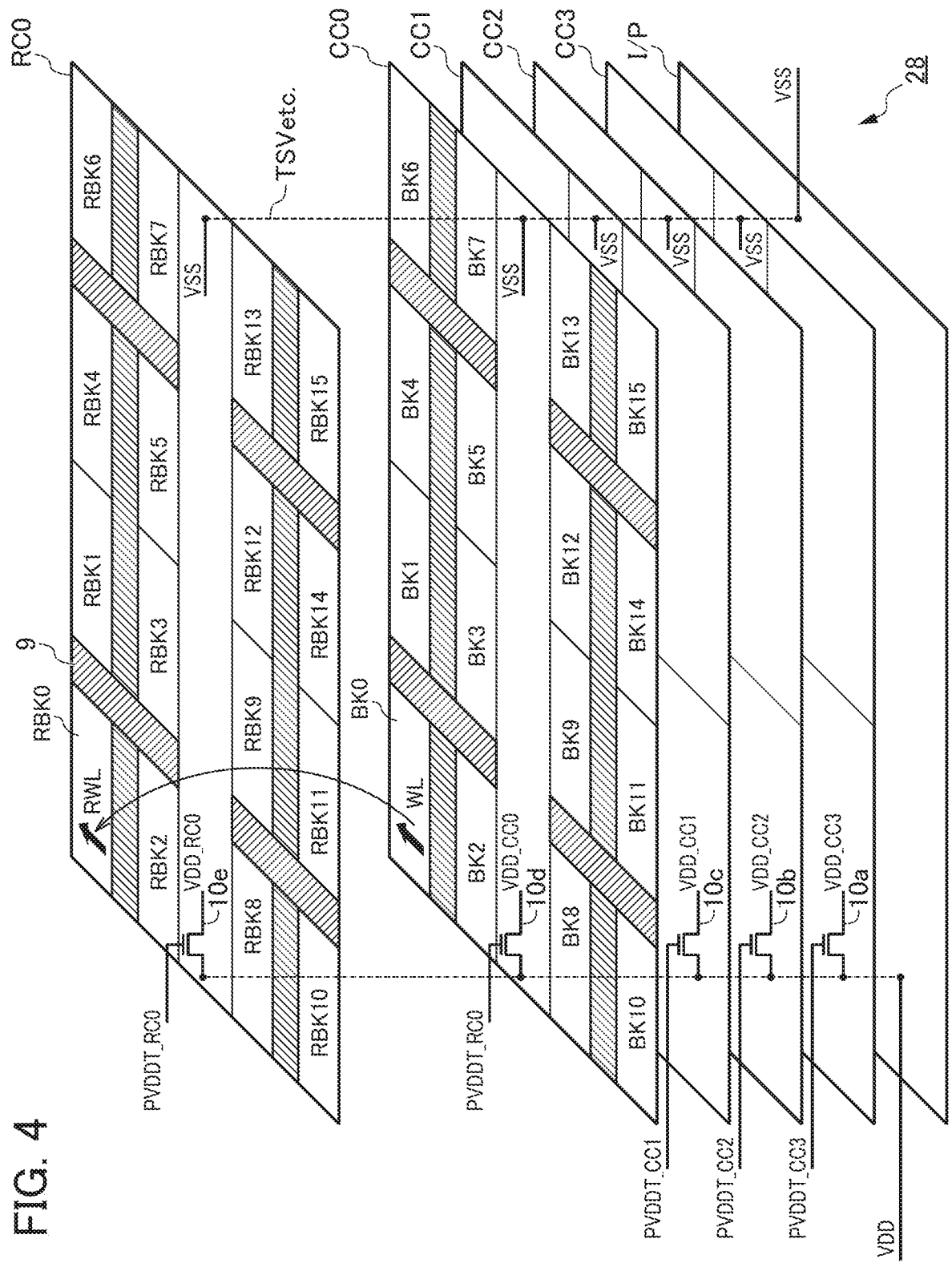
FIG. 4 is a chip configuration diagram of a layered DRAM 28 according to a third embodiment.

FIG. 4 is a chip configuration diagram schematically illustrating the configuration of the layered DRAM 28 similar to FIG. 1 in the first embodiment. Similarly to the first embodiment, in the layered DRAM 28 according to the third embodiment, a plurality of memory chips CC0, CC1, CC2, and CC3 are superimposed and bonded. In addition, similarly to the first embodiment, the interposer chip I/P is bonded to one surface of the plurality of memory chips CC superimposed thereon, and the reserve memory chip RC0 for reserve of the memory chip CC is bonded on the other side thereof.

Memory Chip CC, Reserve Memory Chip RC0

The memory chip CC and the reserve memory chip RC0 according to the third embodiment have the same configuration as that of the first embodiment.

Interposer Chip I/P

The interposer chip I/P according to the third embodiment has the same functions as the interposer chip described in the first embodiment. In the third embodiment, in addition to the configuration and functions of the interposer chip I/P according to the first embodiment, the interposer chip I/P has a function of inspecting the address of the word line for each of the memory chips and the reserve memory chip RC0 and switching and selecting the chip to be accessed. By having such a function, in a case where a defect is detected (found) in any one of the word lines, the access to the defective word line WL (memory chip CC having the defective word line WL) can be switched to the access to the word line RWL of the reserve memory chip RC0 (refer to FIG. 4).

By executing such access switching, in a case where a defect is detected in any one of the word lines, the word line on the reserve memory chip RC0 can be used instead of the defective word line. As a result, in the manufacture of the layered DRAM 28 (layered chip), a reduction in yield can be suppressed.

In particular, in the third embodiment, since the word line WL on which a defect is detected on the memory chip CC is replaced with the word line RWL on the reserve memory chip RC0, the ability of repairing of the memory cell on the regular memory chip CC can be reduced. In many cases, in the memory cell of the memory chip CC, a repair word line is provided in preparation for a defect of the word line. However, since the number of word lines provided for this repair can be reduced, it is possible to reduce the area of the memory chip CC.

Figure 8:
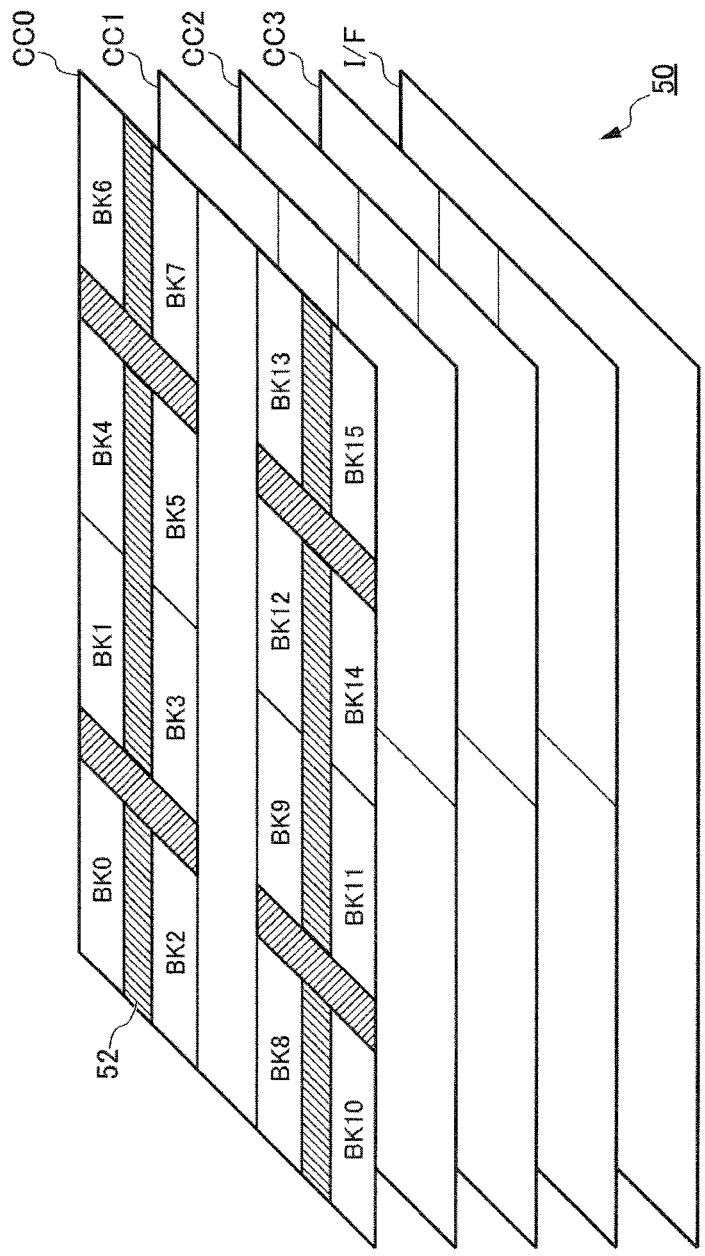
FIG. 8 is a schematic diagram illustrating a state in which a plurality of semiconductor chips are layered to constitute a layered DRAM 50 in the related art.
Figure 9:
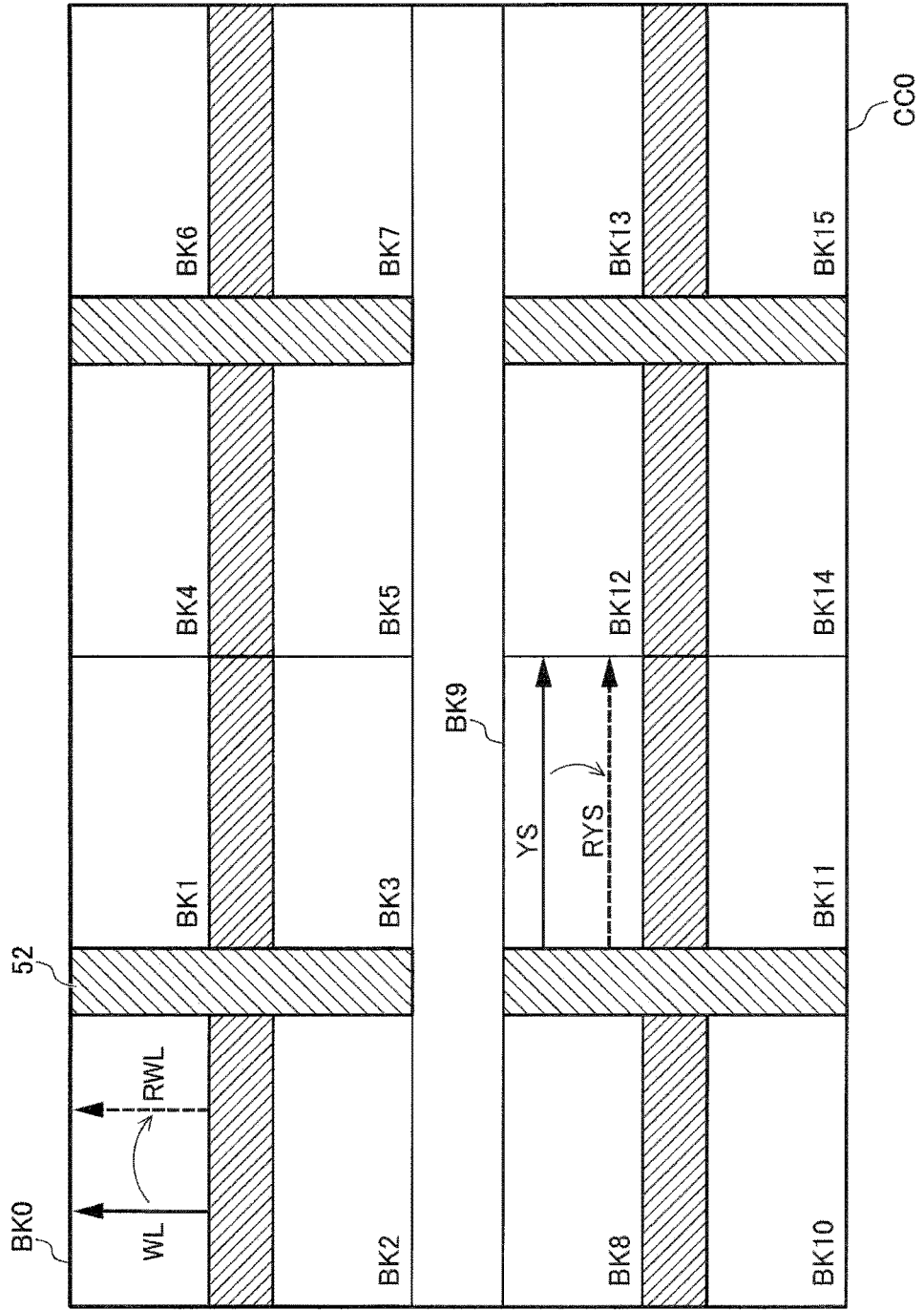
FIG. 9 is a plan diagram of one memory chip CC0 in FIG. 8.

In addition, the repair word line provided in the memory chip CC can also be used as a repair word line for switching access to a defective word line on the same memory chip CC. That is, it is also possible to combine the related art as illustrated in FIG. 8. Even when the related art illustrated in FIG. 8 for switching to the repair word line is used in combination, the defect information can be stored in the fuse in the interposer chip I/P. The control for switching the defective bit line to the repair bit line can be performed in the same manner. In addition, similarly to the reserve memory chip RC0, the control for switching the defective word line and the defective bit line to the repair word line and the repair bit line may be used together in the same chip. By doing so, it is possible to further increase the production yield of the product. In addition, in a case where there is room to arrange the fuse in the interposer chip I/P, by arranging the fuse for this control in the interposer chip I/P, the area of the memory chips CC and the reserve memory chip RC0 can be reduced.

As described above, according to the third embodiment, even in a case where a large-scale defect such as a current-defective chip or the like is not detected at the time of WOW layering, for example, since a defect is detected for each individual control line, the reserve memory chip RC0 can be effectively used, so that it is possible to improve the production yield. In addition, a control line for switching the memory chip to be accessed is transmitted by using the ThruChip Interface (TCI) technology similar to that of the first embodiment.

Operation of Layered DRAM 28

Figure 5:
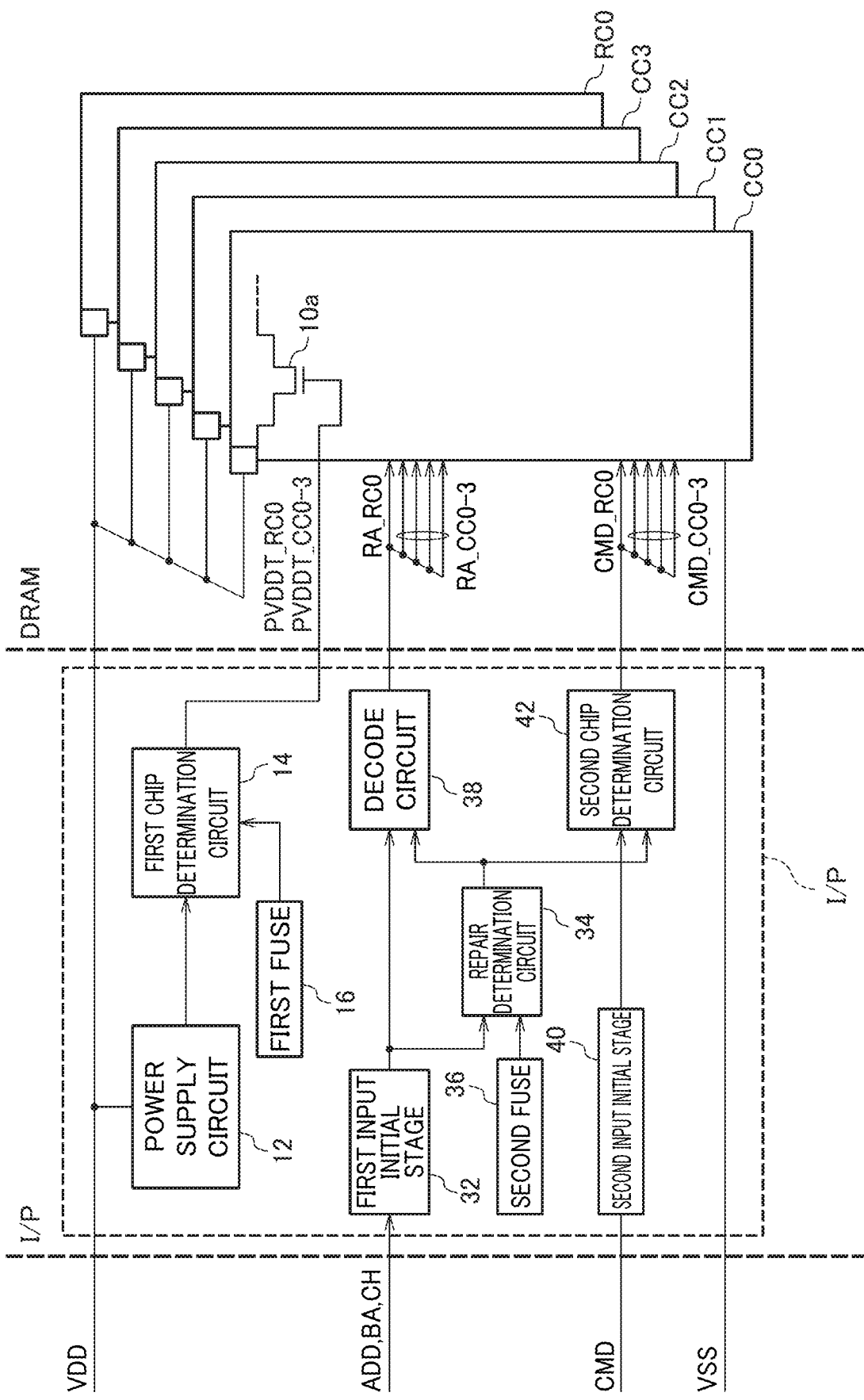
FIG. 5 is an explanatory diagram illustrating a connection configuration between chips of the layered DRAM 28 according to the third embodiment.

The operations of the layered DRAM 28 according to the third embodiment include the functions and operations of the layered DRAM 8 according to the first embodiment. FIG. 5 illustrates a state of signal connection between the functional block of the interposer chip I/P and the memory chip CC and the reserve memory chip RC in the third embodiment. FIG. 5 is a diagram corresponding to FIG. 2 in the first embodiment.

Similarly to the layered DRAM 8 according to the first embodiment, as illustrated in FIG. 5, the layered DRAM 28 according to the third embodiment includes a power supply circuit 12, a first chip determination circuit 14, and a first fuse circuit 16. The operations of the means are the same as those of the first embodiment. For example, information on the result of the wafer test is stored in the first fuse circuit 16, and the first chip determination circuit 14 outputs a control signal for the clamp MOSFET 20 of the channel on the memory chip CC and the reserve memory chip RC0 on the basis of the contents stored in the first fuse circuit 16 when the power supply is turned on. Therefore, instead of the defective memory chip CC, the reserve memory chip RC0 can be operated. In addition, as illustrated in FIG. 5, the interposer chip I/P of the layered DRAM 28 includes a first input initial stage circuit 32, a second fuse circuit 36, a repair determination circuit 34, a decode circuit 38, a second input initial stage circuit 40, and a second chip determination circuit 42.

Hereinafter, examples of addresses and commands will be described as examples of the control signals from the outside.

Address

The first input initial stage circuit 32 is an initial stage circuit that inputs an ADD (address) signal or the like as a control signal. As the control signal, signals such as BA and CH (channel) may be used, or various other control signals may be used. These correspond to preferred examples of the "control signal from the outside" in the claims.

The decode circuit 38 decodes various control signals input by the first input initial stage circuit and outputs signals for controlling the control lines (for example, word lines) in the memory chip CC. The signal decoded and output by the decode circuit 38 is supplied to the memory chip CC or the reserve memory chip RC0 through contactless communication using the TCI technology.

Similarly to the first fuse circuit 16, the second fuse circuit 36 is a storage means for storing information on the defect of the circuit, and particularly, is a means for storing information on defects relating to the control lines in the memory chip CC.

The repair determination circuit 34 can determine the control line to be repaired on the basis of the information stored in the second fuse circuit 36. Then, it is determined whether or not the control signal supplied through the first input means circuit causes access to the control line to be repaired. As a result of the determination, in a case where it is determined that an access to a control line to be repaired (a control line on which a defect is detected) is caused, a repair signal is output.

On the basis of this repair signal, the decode circuit 38 can determine whether or not the control line being decoded is an object to be repaired. Then, in a case where the control line being decoded is an object to be repaired, the output destination of the decoded signal is switched from the memory chip CC to the reserve memory chip RC0. Therefore, instead of the control line on which a defect is detected on the memory chip CC, the access object can be set to the reserve memory chip RC0 side.

FIG. 5 illustrates an example in which the decode circuit 38 outputs signal lines RA_CC0 to CC3 (dedicated to the memory chip CC) and RA_RC0 (dedicated to the reserve memory chip RC0) for controlling the word line WL. For example, in a case where there is no defect in the word line WL, the signal line RA_CC0 is output to the memory chip CC0 by the ADD (address signal) from the outside, whereas in a case where a defect is found, the signal line is switched by the repair signal, and the signal line RA_RC0 is output to the reserve memory chip RC0. In this manner, by switching the access to the control line (for example, the word line WL), it is possible to use the control line (for example, the word line RWL) on the reserve memory chip RC0 instead of the control line to be repaired. As a result, it is possible to improve the production yield of the layered DRAM 28.

Command

Furthermore, as illustrated in FIG. 5, the second input initial stage circuit 40 is an initial stage circuit for inputting CMD (command) signals and the like which are other types of the control signals. Since the access to the memory chip CC occurs even with the control signal such as a command signal, it is preferable to handle the command signals similarly to the case of the address (ADD) described above. This CMD (command) signal also corresponds to a preferred example of the "control signal from the outside" in the claims. As the "control signal from the outside", various kinds of command signals, for example, various signals such as read, write, and verify can be used.

On the basis of the command signal input by the second input initial stage circuit 40, the second chip determination circuit 42 selects the memory chip CC to which the command signal is to be output and outputs the command signal for the selected memory chip CC or a signal of the control line for controlling the command signal. The signal output from the second chip determination circuit 42 is also supplied to the memory chip CC or the reserve memory chip RC0 by the contactless communication using TCI technology.

The second chip determination circuit 42 can determine whether or not the signal to be output is an object to be repaired on the basis of the above-mentioned repair signal. Then, in a case where the command signal to be output (or the signal for controlling the command signal) relates to a signal to be repaired, the output destination of the signal is switched from the memory chip CC to the reserve memory chip RC0. Therefore, the second chip determination circuit 42 may output a signal to the control line of the command signal of the reserve memory chip RC0 instead of the control signal of the command signal on which a defect is detected on the memory chip CC. In this manner, in the third embodiment, the so-called access destination is switched. FIG. 5 illustrates a state in which the second chip determination circuit 42 outputs the signal lines CMD_CC0 to CC3 (dedicated to the memory chip CC) and CMD_RC0 (dedicated to the reserve memory chip RC0), respectively, on the basis of the command signal (CMD).

For example, in a case where no defect is detected in the control line of the command signal, the second chip determination circuit 42 outputs, for example, the signal line CMD_CC0 to the memory chip CC0, whereas in a case where a defect is found, the signal line is switched by the repair signal, and the signal line CMD_RC0 is output to the reserve memory chip RC0. As a result of such operation, the production yield of the layered DRAM 28 (layered chip) according to the third embodiment can be improved.

Third Embodiment: Summary

As a result of such processing, for example, the control line of the reserve memory chip RC0 can be used instead of the control line of the defective memory chip CC0, for example, so that it is possible to reduce the possibility of the layered DRAM 28 becoming defective, and thus, it is possible to improve the production yield of the layered DRAM 28. The characteristic feature of the third embodiment is in that, in a case where access is made to a control line in which a defect is detected, the transmission destination of the signal output to the control line is configured to be changed. Even in a case where a plurality of defects are detected in the memory chip CC as a result of switching the access in this manner, it is possible to replace the memory chip with the reserve memory chip RC0 for each control line.

In the third embodiment, defect detection is performed on the control line in this manner, but various control lines such as a word line and a bit line can be set to be an object. In addition, the control signals and the like output to these control lines are communicated by using contactless communication using the TCI. In addition, similarly to the first fuse circuit 16, the second fuse circuit 36 also corresponds to a preferred example of the storage unit in the claims. In addition, the repair determination circuit 34 corresponds to a preferred example of the determination unit in the claims. In addition, the decode circuit 38 and the second chip determination circuit 42 correspond to a preferred example of the control unit in the claims.

3-2. 2 of Third Embodiment

In the third embodiment, in a case where an access is made to a control line in which a defect is detected, the transmission destination of the signal output to the control line is changed (the access destination is changed), that is, the access is configured as to be switched. With such a configuration, even in a case where a plurality of defects are detected in the memory chip CC as a result of switching the access, it is possible to perform replacement with the reserve memory chip RC0 for each control line. However, the operation of switching the access to such a control line to the reserve memory chip RC0 is executed even in a case where a defective chip as described in the first and second embodiments is found or even in a case where a defective block is found. In addition, even in a case where a bit defect which is a defect of the bit line or a word line defect which is a defect of the word line is found on the memory chip CC, the operation is executed. That is, in a case where a defective chip is found among the plurality of memory chips CC, the interposer chip I/P can switch the access to the control line of the defective chip to the access to the control line of the reserve memory chip RC0. In addition, in a case where a defective block is found among the plurality of memory chips CC, the interposer chip I/P can switch the access to the control line of the defective block to the access to the control line of the reserve memory chip RC0. In addition, in a case where a bit defect or a word line defect is found on the memory chip, the interposer chip I/P can switch the access to the control line of the memory chip where the bit defect or the word defect is found to the access to the control line of the reserve memory chip. In order to realize such operations, basically, while adopting the configuration described in the third embodiment, the following operations are executed.

For example, the second fuse circuit 36 described above may be any means as long as the second fuse circuit stores the information on any defect of the memory chip CC. For example, similarly to the third embodiment, in a case where a defective chip is found among the memory chips CC in addition to the defect of the control line, it is preferable to store the information on the defective chip. In addition, in a case where a defective block which is a defect of a circuit block is found on the memory chip CC, it is preferable to store the information on the defective block. In addition, in a case where a bit defect which is a defect of a bit line or a word defect which is a defect of a word line is found on the memory chip CC, it is preferable to store the information on the bit defect and the word defect. In addition, it is preferable that the second fuse circuit stores any defect as long as the defect is a defect found in the memory chip CC and is a defect that is replaced with the reserve memory chip RC0. In addition, the repair determination circuit 34 described above can determine the object to be repaired on the basis of the information stored in the second fuse circuit 36. Then, it is determined whether or not the control signal supplied through the first input means circuit causes access to the control line for the object to be repaired. As a result of the determination, in a case where it is determined to cause access to the object to be repaired, a repair signal is output.

Herein, the object to be repaired is a defective chip found in the memory chip CC, a defective block found in the circuit block, or a bit defect or a word defect found on the memory chip CC. However, the object to be repaired may be a defect of any portion as long as the defect is replaced with the reserve memory chip RC0. In addition, on the basis of this repair signal, the above-described decode circuit 38 can determine whether or not the control line being decoded is a control line for an object to be repaired. In a case where the control line being decoded is a control line for the object to be repaired, switching of the output destination of the decoded signal from the memory chip CC to the reserve memory chip RC0 is the same as that in the third embodiment. In addition, the above-described second chip determination circuit 42 can determine whether or not the signal to be output is a signal for an object to be repaired, on the basis of the above-mentioned repair signal. Then, in a case where the command signal to be output (or the signal for controlling the command signal) relates to the signal for the object to be repaired, the output destination of the signal is switched from the memory chip CC to the reserve memory chip RC0. Therefore, similarly to the third embodiment, instead of the control line for the object on which the defect is detected on the memory chip CC, the second chip determination circuit 42 can output a signal to the control line for the corresponding object on the reserve memory chip RC0.

For example, in a case where a defective block is found on the memory chip CC, the corresponding object is a circuit block on the reserve memory chip RC corresponding to the defective block. In addition, for example, in a case where a bit defect is found on the memory chip CC, the corresponding object is a bit line on the reserve memory chip RC corresponding to the bit defect.

2 of Third Embodiment: Summary

As a result of such processing, it is possible to switch the access to the memory chip CC0 where any defect is found to access to the reserve memory chip RC0. Therefore, the possibility that the layered DRAM 28 becomes a defective product can be reduced, and thus, it is possible to improve the production yield of the layered DRAM 28. The characteristic feature of 2 of the third embodiment is in that, in a case where an access is made to a memory chip CC in which any defect is detected, the access destination is configured to be changed so as to be dedicated to the reserve memory chip RC0. In this manner, as a result of switching the access, in a case where any one of a plurality of defects is detected in the memory chip CC, the reserve memory chip RC0 can be used by replacing.

4. Fourth Embodiment

Figure 6:
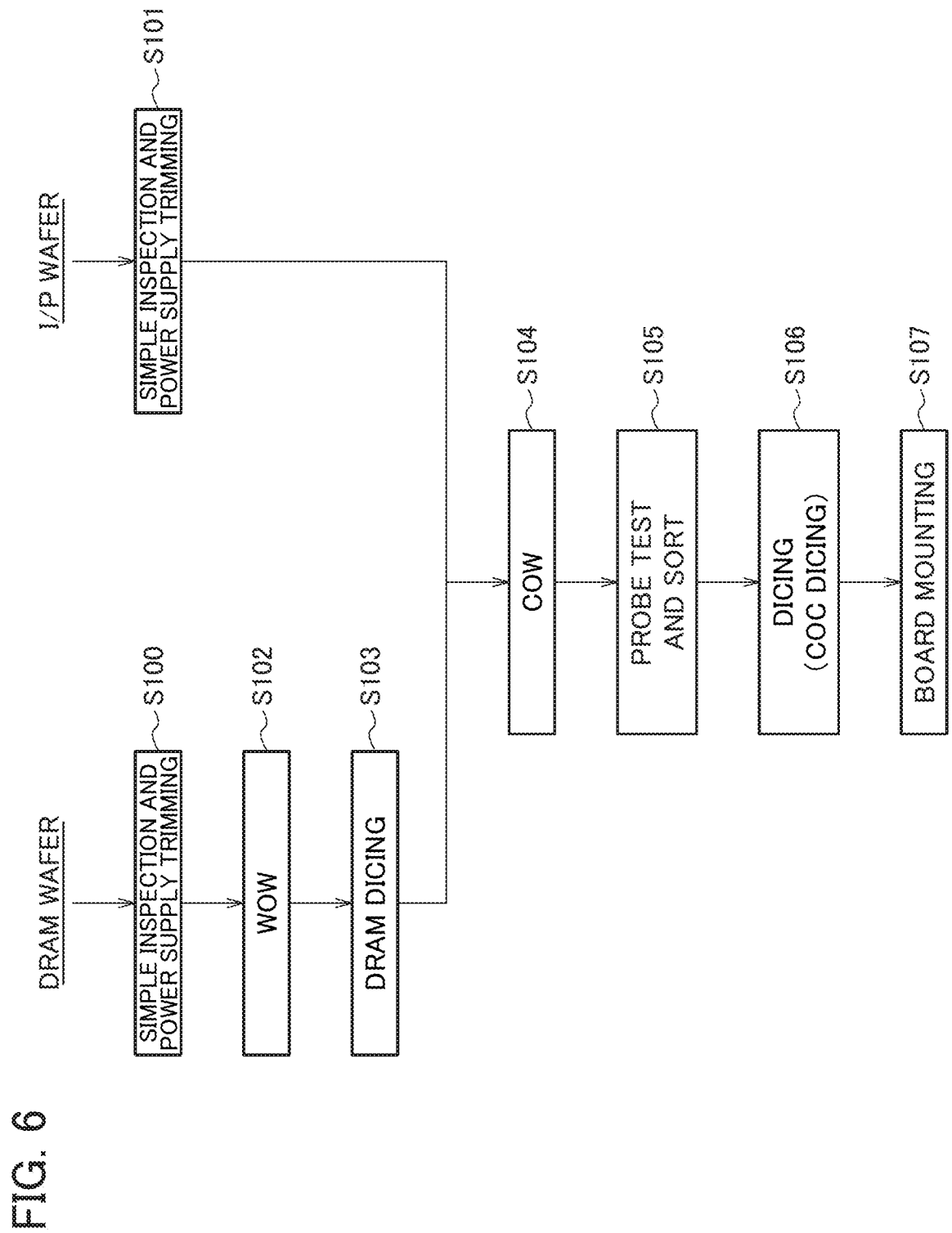
FIG. 6 is a flowchart illustrating a portion of processes of manufacturing the layered DRAMs 8, 18, and 28.

Next, a portion of the processes of manufacturing the layered chip of the layered DRAMs 8, 18, and 28 described in the first to third embodiments will be described with reference to flowcharts. FIG. 6 is a flowchart illustrating a portion of the processes of manufacturing the layered DRAMs 8, 18, and 28 (chip layered body) having the reserve memory chip RC0 described in the first to third embodiments.

First, in step S100, the DRAM wafer which is a semiconductor wafer to be the memory chip CC and the reserve memory chip RC0 is inspected as a single unit. This inspection is a simple inspection and is executed for the purpose of removing wafers which may cause low yields in advance, and power supply trimming is also performed. In this inspection, in a case where a current-abnormal chip (defective chip) is detected, the inspector side (tester) stores the information on the chip. As described in the first embodiment, the defect detected herein is stored in the first fuse circuit 16 and used when the power supply of the device is turned on. In addition, step S100 corresponds to a preferred example of the wafer inspection step in the claims. In addition, in this inspection in step S100, in a case where an abnormality is also detected in the circuit block BK, the information on the block BK is similarly stored in the inspector side (tester). As described in the second embodiment, the information on the defective circuit block detected herein is stored in the first fuse circuit 16 later. Step S100 also corresponds to a preferred example of the on-wafer block inspection step in the claims.

In step S101, an I/P wafer which is a semiconductor wafer to be the interposer chip I/P is inspected as a single unit. This inspection is also a simple inspection similar to step S100. In this inspection, in a case where a defect such as current abnormality is found, the interposer chip I/P is discarded. In addition, since the interposer chip I/P is manufactured by a logic process, there are few defects caused by manufacturing as compared with the memory chip CC manufactured by a memory process. Therefore, even in a case where the interposer chip I/P may be discarded in step S101, the influence on the production yield of the layered DRAM is negligibly small.

In step S102, a plurality of DRAM wafers are connected by using fusion bonding (WOW: Wafer On Wafer). Therefore, the reserve memory chip RC0 and the plurality of memory chips CC are superimposed and layered. In this state, the memory inspection is executed, and the inspector side (tester side) stores defect information on bit line and word line. As described in the third embodiment, the defect information on the control line such as the word line detected herein is stored in the second fuse circuit 36 later. Step S102 corresponds to a preferred example of the first layering step in the claims. In addition, step S102 corresponds to a preferred example of the on-wafer control line inspection step in the claims. In the fourth embodiment, inspection is performed at the stage (this step S102) of layering wafers before dicing and the stage of layered chips after dicing. By such inspection, more accurate defect inspection intends to be performed. In a case where the occurrence rate of defects is low or the like, it is possible to perform inspection of either one of before dicing and after dicing.

In step S103, the DRAM wafers superimposed in step 102 are divided for each device (dicing). In this manner, a layered chip in which semiconductor chips are layered is formed. In the fourth embodiment, a layered chip in which the memory chip CC and the reserve memory chip RC0 are layered is called a DRAM chip. In addition, this layered chip (DRAM chip) corresponds to a preferred example of the layered semiconductor chip in the claims. In addition, step S103 corresponds to a preferred example of the dicing step in the claims.

In step S104, the DRAM chips are layered on the I/P wafer (COW: Chip On Wafer). Herein, in step S100, the information on the defective chip such as the current-abnormal chip and the information on the defective circuit block BK stored in the tester side are written in the first fuse circuit 16 on the I/P chip. This writing is executed by disconnecting a predetermined fuse by applying a predetermined high voltage to the first fuse circuit 16. As described in the first and second embodiments, the information written herein is referred to by the first chip determination circuit 14 when the power supply is turned on, and the information is used for a process of replacing the memory chip CC or the like with a reserve memory chip or the like. Step S104 corresponds to a preferred example of the second layering step in the claims. That is, the layering process with the control chip in the claims also includes the case of layering the I/P wafer (semiconductor wafer) including the interposer chip which is the control chip. In addition, step S104 corresponds to a preferred example of the storage step in the claims.

In step S105, memory inspection is executed in a state where the DRAM chip and the I/P wafer are layered. This memory inspection is executed by using a probe card provided in a so-called semiconductor test apparatus or the like. The defects of the word line and the bit line newly detected in this inspection are temporarily stored in the tester side similarly to the defects detected in step S102. Step S105 corresponds to a preferred example of the control line inspection step in the claims. Next, information on the defect of the control line such as the word line, which has been stored on the tester side, is written in the second fuse circuit 36. Writing is performed by the method described in step S104. As described in the third embodiment, the information written herein is referred to by the second chip determination circuit 42 when the power supply is turned on, and the information used for a process such as changing the access to the word line WL to the access to the word line RWL on the reserve memory chip RC0. Step S105 corresponds to a preferred example of the storage step in the claims.

In step S106, the I/P wafer is diced. As a result, the layered DRAM 8 (18, 28) which is a layered chip in which the reserve memory chip RC0, the plurality of memory chips CC, and the interposer chip I/P are layered is formed.

In step S107, the layered DRAM 8 is mounted on a board and connected to a CPU and the like to form a computer system.

4. 2 of Fourth Embodiment

Figure 7:
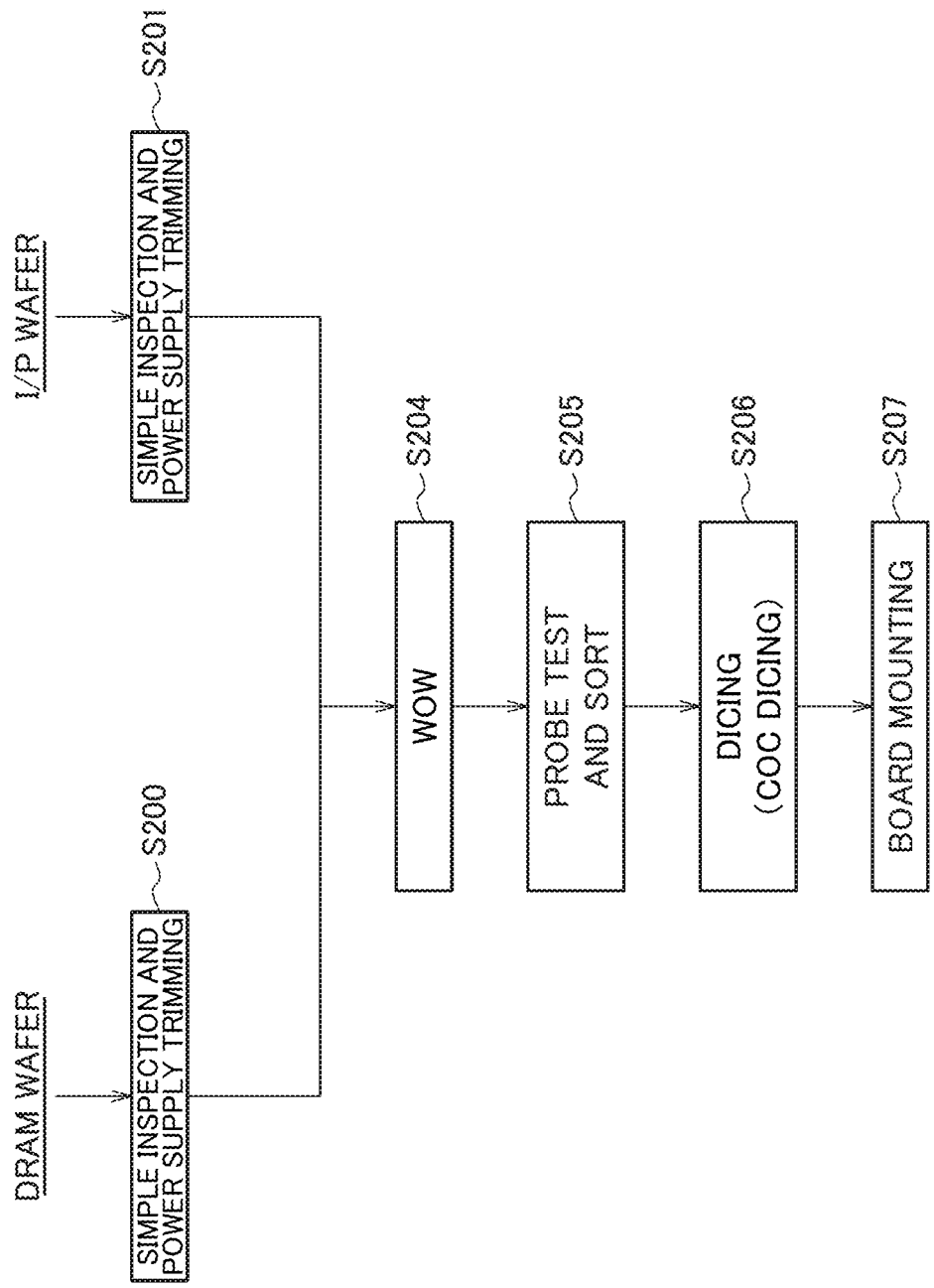
FIG. 7 is a flowchart illustrating a portion of processes of manufacturing the layered DRAMs 8, 18, and 28.

In the fourth embodiment described above, the layered DRAM 8 (18, 28) is manufactured according to the flowchart illustrated in FIG. 6, but the layered DRAM may be manufactured according to the flowchart illustrated in FIG. 7. FIG. 7 is a flowchart illustrating a portion of the manufacturing process of the layered DRAMs 8, 18, and 28 including the reserve memory chip RC0 described in the first to third embodiments.

Steps S200 and S201 illustrated in FIG. 7 are the same as steps S100 and S101 illustrated in FIG. 6, respectively. The flowchart illustrated in FIG. 7 is greatly different from the flowchart illustrated in FIG. 6 in that steps corresponding to S102 and S103 do not exist.

In the flowchart illustrated in FIG. 6, the plurality of DRAM wafers are connected by fusion bonding (S102) and are diced (S103), and after that, the plurality of the DRAM chips are layered on the I/P wafer (S104). On the other hand, in the flowchart of FIG. 7, the plurality of DRAM wafers are layered together with the I/P wafer subjected to step S201 (WOW: Wafer On Wafer) in step S204 after being subjected to step S200. Step S204 corresponds to a preferred example of the third layering step in the claims.

Herein, in step S200, the information on the defective chip such as the current-abnormal chip and the information on the defective circuit block BK stored in the tester side are written in the first fuse circuit 16 on the I/P chip. This writing is executed by disconnecting a predetermined fuse by applying a predetermined high voltage to the first fuse circuit 16. As described in the first and second embodiments, the information written herein is referred to by the first chip determination circuit 14 when the power supply is turned on, and used for a process of replacing the memory chip CC or the like with a reserve memory chip or the like. Step S204 corresponds to a preferred example of the storage step in the claims.

In step S205, memory inspection is performed on a plurality of DRAM wafers in a state of being layered in a WOW manner. The defect information determined by the memory inspection is written in the second fuse 36 in the I/P wafer. In addition, the defect information acquired by the simple inspection in step S200 is written in the first fuse 16. Step S205 corresponds to a preferred example of the storage step in the claims.

In step S206, the plurality of DRAM wafers and the I/P wafer are diced in a layered state. As a result, the layered DRAM 8 (18, 28) which is a layered chip in which the reserve memory chip RC0, the plurality of memory chips CC, and the interposer chip I/P are layered is formed. Step S206 corresponds to a preferred example of the dicing step in the claims.

In step S207, similarly to the step S107, the layered DRAM 8 is mounted on a board and connected to a CPU or the like to form a computer system.

As described above, the layered DRAMs 8, 18, and 28 described in the first to third embodiments can be manufactured. Particularly, since the information on the defects detected by inspection during the manufacturing process is stored in the first fuse circuit 16 and the second fuse circuit 36, it is possible to replace the defective portion when the power supply is turned on. The replacing operation is the same as already described in the first to third embodiments.

5. Other Modified Examples (A) With Respect to Fuse Circuit

In the first to fourth embodiments, the first fuse circuit 16 and the second fuse circuit 36 have been described as a means for storing information on defects. However, these fuse circuits are equivalent to a preferred example of the storage unit in the claims. In the embodiment, for the convenience of description, two separate fuse circuits have been described, but it is also preferable to share a single fuse circuit.

(1) However, it is also preferable to use various nonvolatile memories as the storage unit instead of these fuse circuits. It is also preferable that the information is configured to be written by laser trimming on the interposer chip I/P and this information is used as a storage unit.

(2) In addition, instead of incorporating these fuse circuits in the interposer I/P chip, a storage means storing information on defects may be externally connected. That is, the storage means corresponding to the first fuse circuit 16, the second fuse circuit 36 illustrated in FIG. 2, FIG. 5, or the like may be configured to be externally connected. In this case, a circuit which supplies a predetermined control signal to the interposer I/P chip may be used instead of the storage means externally connected.

(3) In addition, in the fourth embodiment, the configuration is described where the inspection is performed during the manufacturing process and the inspection result is stored by an external inspector side (tester side). Then, information on the stored defect is separately written in the first fuse circuit 16 and the second fuse circuit 36. However, it is also preferable to incorporate a self-inspection circuit that executes self-inspection on the interposer chip I/P autonomously. It is also preferable that the self-inspection circuit autonomously executes the inspection and autonomously writes the result in the first fuse circuit 16 and the second fuse circuit 36. In this case, it is also preferable that the written contents are configured to be separately read out from the outside.

(B-1) With Respect to Contactless Communication

In the first to fourth embodiments described above, signal transmission/reception between layered semiconductor chips is performed by contactless communication (TCI), and in particular, the magnetic coupling (inductive coupling) between coils is used. However, other types of contactless communication may be used.

The contactless communication referred to herein denotes that one communication unit performing communication and the other communication unit performing communication perform communication without being in contact with each other and without a conductive member (one or more of solder, a conductive adhesive, a wire, and the like) being interposed. In addition, the phrase "performing communication by contact" denotes that one communication unit performing communication and the other communication unit performing communication perform communication in contact with each other or perform communication with a conductive member (one or more of solder, a conductive adhesive, a wire, and the like) being interposed. In addition, the communication unit is a concept including a portion for transmitting and receiving, a portion for only transmitting, and a portion for only receiving. In the contactless communication, magnetic field coupling (inductive coupling) between coils is used, but the countless communication is not limited thereto. In the contactless communication, magnetic resonance between coils may be used. In addition, in the contactless communication, a coil may not be used, and for example, an optical signal or a sound wave signal may be used. This configuration is also a preferred example constituting the contactless communication unit in the claims.

(B-2) With Respect to Transmission/Reception of Signals Between Layered Semiconductor Chips Signal transmission/reception between the layered semiconductor chips may be communication through a conductor (contact communication). For example, signal transmission/reception between the layered semiconductor chips may be performed through through-silicon via (TSV). In addition, a portion of the signal transmission/reception between layered semiconductor chips may be configured as contactless communication, and transmission/reception other than the portion of the signal transmission/reception between the layered semiconductor chips may be configured as contact communication. For example, the control signals (PVDDT_CC0, PVDDT_CC1, PVDDT_CC2, PVDDT_CC3, and PVDDT_RC0) output from the interposer chip I/P are supplied to the respective semiconductor chips by using the TSV similarly to the power supply line, and the signals (data signals, address signals, and the like) other than the power supply line and the control signals may be supplied by the contactless communication. Alternatively, the control signals (PVDDT_CC0, PVDDT_CC1, PVDDT_CC2, PVDDT_CC3, and PVDDT_RC0) output from the interposer chip I/P may be supplied by contactless communication, and the signals (data signals, address signals, and the like) other than the power supply line and the control signals may be supplied to each semiconductor chip by using the TSV.

(C) With Respect to Layering

In the first to fourth embodiments described above, the example in which the reserve memory chip RC0, the plurality of memory chips CC, and the interposer chip I/P are layered in this order is described, but the order is not limited thereto, and any order may be used.

(D) With Respect to Interposer Chip I/P

In the first to fourth embodiments described above, the interposer chip I/P has a function of replacing a memory chip or the like in which a defect is detected, but the function is not limited to the interposer chip I/P. By merely using a semiconductor chip of Logic-Die, the function of replacing the memory chip CC or the like may be provided on this Logic-Die. That is, a semiconductor chip other than the interposer chip I/P may be used as long as the means described in FIG. 2, FIG. 5, or the like are provided. Similarly to the interposer chip I/P, the semiconductor chip also corresponds to a preferred example of the control chip in the claims.

Although the embodiments of the present invention have been described above in detail, the above-described embodiments merely illustrate specific examples for implementing the invention. The technical scope of the invention is not limited to the above embodiments. The present invention can be variously modified without departing from the spirit of the invention, and these modifications are also included in the technical scope of the invention.

EXPLANATION OF REFERENCE NUMERALS 8, 18, 28, 50 LAYERED DRAM
9, 52 PERIPHERAL CIRCUIT GROUP
10a, 10b, 10c, 10d, 10e CLAMP MOSFET
12 POWER SUPPLY CIRCUIT
14 FIRST CHIP DETERMINATION CIRCUIT
16 FIRST FUSE CIRCUIT
20a, 20b, 20c, 20d, 20e, 20f, 20g, 20h, 20i, 20j, 20k, 20l, 20m, 20n, 20 CLAMP MOSFET
32 FIRST INPUT INITIAL STAGE CIRCUIT
34 REPAIR DETERMINATION CIRCUIT
36 SECOND FUSE CIRCUIT
38 DECODE CIRCUIT
40 SECOND INPUT INITIAL STAGE CIRCUIT
42 SECOND CHIP DETERMINATION CIRCUIT
BK0, BK1, BK2, BK3 CIRCUIT BLOCK
CC0, CC1, CC2, CC3 MEMORY CHIP
I/F INTERFACE CHIP
I/P INTERPOSER CHIP
RC0 RESERVE MEMORY CHIP

The invention claimed is:

1. A method for manufacturing a layered semiconductor device including, layered therein, a plurality of semiconductor chips, a reserve semiconductor chip which is used as a reserve for the semiconductor chip, and a control chip which includes a storage unit and controls operating states of the plurality of semiconductor chips and an operating state of the reserve semiconductor chip on the basis of information stored in the storage unit, the method comprising:

a wafer inspection step of inspecting a semiconductor wafer including the plurality of the semiconductor chips and a semiconductor wafer including the reserve semiconductor chip to detect information on a defective semiconductor chip;

a first layering step of layering the inspected semiconductor wafer including the plurality of the semiconductor chips and the inspected semiconductor wafer including the reserve semiconductor chip;

a dicing step of dicing the layered semiconductor wafer to form a layered semiconductor chip in which a plurality of the semiconductor chips and the reserve semiconductor chip are layered;

a second layering step of layering the layered semiconductor chip and the control chip; and a storage step of storing the information on the defective semiconductor chip in the storage unit of the control chip.

2. A method for manufacturing a layered semiconductor device including, layered therein, a plurality of semiconductor chips, a reserve semiconductor chip which is used as a reserve for the semiconductor chip, and a control chip which includes a storage unit and controls operating states of the plurality of semiconductor chips and an operating state of the reserve semiconductor chip on the basis of information stored in the storage unit, the method comprising:

a wafer inspection step of inspecting a semiconductor wafer including the plurality of the semiconductor chips and a semiconductor wafer including the reserve semiconductor chip to detect information on a defective semiconductor chip;

a third layering step of layering the inspected semiconductor wafer including the plurality of the semiconductor chips, the inspected semiconductor wafer including the reserve semiconductor chip, and a semiconductor wafer including the control chip;

a storage step of storing the information on the defective semiconductor chip in the storage unit of the control chip; and a dicing step of dicing the layered semiconductor wafer to form a layered semiconductor chip in which the plurality of the semiconductor chips, the reserve semiconductor chip, and the control chip are layered.

3. A method for manufacturing a layered semiconductor device including, layered therein, a plurality of semiconductor chips, a reserve semiconductor chip which is used as a reserve for the semiconductor chip, and a control chip which includes a storage unit and controls operating states of circuit blocks of the plurality of semiconductor chips and an operating state of a circuit block of the reserve semiconductor chip on the basis of information stored in the storage unit, the method comprising:

an on-wafer block inspection step of inspecting a semiconductor wafer including the plurality of the semiconductor chips and a semiconductor wafer including the reserve semiconductor chip to detect information on a defective circuit block of the circuit block in the semiconductor chip included in the semiconductor wafer;

a first layering step of layering a plurality of the inspected semiconductor wafers including the semiconductor chip including the defective circuit block and the semiconductor wafer including the reserve semiconductor chip;

a dicing step of dicing the layered semiconductor wafer to form a layered semiconductor chip in which the plurality of the semiconductor chips and the reserve semiconductor chip are layered;

a second layering step of layering the layered semiconductor chip and the control chip; and a storage step of storing the information on the defective circuit block in the storage unit of the control chip.

4. A method for manufacturing a layered semiconductor device including, layered therein, a plurality of semiconductor chips, a reserve semiconductor chip which is used as a reserve for the semiconductor chip, and a control chip which includes a storage unit and controls operating states of circuit blocks of the plurality of semiconductor chips and an operating state of a circuit block of the reserve semiconductor chip on the basis of information stored in the storage unit, the method comprising:

an on-wafer block inspection step of inspecting a semiconductor wafer including the plurality of the semiconductor chips and a semiconductor wafer including the reserve semiconductor chip to detect information on a defective circuit block of the circuit block in the semiconductor chip included in the semiconductor wafer;

a third layering step of layering a plurality of the inspected semiconductor wafers including the semiconductor chip including the defective circuit block, the inspected semiconductor wafer including the reserve semiconductor chip, and a semiconductor wafer including the control chip;

a storage step of storing the information on the defective circuit block in the storage unit of the control chip; and a dicing step of dicing the layered semiconductor wafer to form a layered semiconductor chip in which the plurality of the semiconductor chips, the reserve semiconductor chip, and the control chip are layered.

5. A method for manufacturing a layered semiconductor device including, layered therein, a plurality of semiconductor chips, a reserve semiconductor chip which is used as a reserve for the semiconductor chip, and a control chip which includes a storage unit and controls states of access to control lines of the plurality of semiconductor chips and a state of access to a control line of the reserve semiconductor chip on the basis of information stored in the storage unit, the method comprising:

a first layering step of layering a semiconductor wafer including the plurality of the semiconductor chips and the semiconductor wafer including the reserve semiconductor chip;

a dicing step of dicing the layered semiconductor wafer group to form a layered semiconductor chip in which the plurality of the semiconductor chips and the reserve semiconductor chip are layered;

a second layering step of layering the layered semiconductor chip and the control chip;

a control line inspection step of inspecting the layered semiconductor chip to detect information on a defective control line of the control line in the semiconductor chip included in the semiconductor wafer; and a storage step of storing the information on the defective control line in the storage unit of the control chip.

6. A method for manufacturing a layered semiconductor device including, layered therein, a plurality of semiconductor chips, a reserve semiconductor chip which is used as a reserve for the semiconductor chip, and a control chip which includes a storage unit and controls states of access to control lines of the plurality of semiconductor chips and a state of access to a control line of the reserve semiconductor chip on the basis of information stored in the storage unit, the method comprising:

a first layering step of layering a semiconductor wafer including the plurality of the semiconductor chips and the semiconductor wafer including the reserve semiconductor chip;

an on-wafer control line inspection step of inspecting the layered semiconductor wafer group to detect information on a defective control line of the control line in the semiconductor chip included in the semiconductor wafer;

a dicing step of dicing the layered semiconductor wafer group to form a layered semiconductor chip in which the plurality of the semiconductor chips and the reserve semiconductor chip are layered;

a second layering step of layering the layered semiconductor chip and the control chip; and a storage step of storing the information on the defective control line in the storage unit of the control chip.

7. A method for manufacturing a layered semiconductor device including, layered therein, a plurality of semiconductor chips, a reserve semiconductor chip which is used as a reserve for the semiconductor chip, and a control chip which includes a storage unit and controls states of access to control lines of the plurality of semiconductor chips and a state of access to control line of the reserve semiconductor chip on the basis of information stored in the storage unit, the method comprising:

a third layering step of layering a semiconductor wafer including the plurality of the semiconductor chips, a semiconductor wafer including the reserve semiconductor chip, and a semiconductor wafer including the control chip;

an on-wafer control line inspection step of inspecting the layered semiconductor wafer to detect information on a defective control line of the control line in the semiconductor chip included in the semiconductor wafer, a storage step of storing the information on the defective control line in the storage unit of the control chip; and a dicing step of dicing the layered semiconductor wafer to form a layered semiconductor chip in which the plurality of the semiconductor chips, the reserve semiconductor chip, and the control chip are layered.

* * * * *